United States Patent
Su

(10) Patent No.: US 9,965,004 B2
(45) Date of Patent: May 8, 2018

(54) HEAT DISSIPATING SYSTEM

(71) Applicant: Hsienchin Su, Tainan (TW)

(72) Inventor: Hsienchin Su, Tainan (TW)

( * ) Notice: Subject to any disclaimer, the term of this patent is extended or adjusted under 35 U.S.C. 154(b) by 378 days.

(21) Appl. No.: 14/820,012

(22) Filed: Aug. 6, 2015

(65) Prior Publication Data

US 2016/0320812 A1   Nov. 3, 2016

(30) Foreign Application Priority Data

May 1, 2015   (TW) .............................. 104114067 A

(51) Int. Cl.
| | |
|---|---|
| *H02K 33/00* | (2006.01) |
| *G06F 1/20* | (2006.01) |
| *H01L 23/367* | (2006.01) |
| *H01L 23/467* | (2006.01) |

(52) U.S. Cl.
CPC ............ *G06F 1/20* (2013.01); *H01L 23/3672* (2013.01); *H01L 23/467* (2013.01)

(58) Field of Classification Search
CPC ...... G06F 1/20; H01L 23/3672; H01L 23/467
USPC .......................................................... 310/25
See application file for complete search history.

(56) References Cited

U.S. PATENT DOCUMENTS

| | | | | | |
|---|---|---|---|---|---|
| 4,266,459 | A | * | 5/1981 | Seregely | .................. G10K 3/00 446/422 |
| 9,011,113 | B2 | * | 4/2015 | Ma | .......................... F04D 33/00 417/410.2 |
| 2011/0259557 | A1 | * | 10/2011 | Chao | ...................... F04B 43/046 165/121 |

* cited by examiner

*Primary Examiner* — Jianchun Qin
(74) *Attorney, Agent, or Firm* — Li & Cai Intellectual Property (USA) Office

(57) ABSTRACT

A heat dissipating system comprises a heat dissipating device including a carrying structure, a driving structure, and at least one swing structure. The carrying structure has a base seat and at least one buffering pad disposed on the base seat. The driving structure is configured to be driven by a periodic power for generating a magnetic field, which has cyclical changes. The swing structure includes a non-metal sheet having an elongated shape and a magnetic actuation disposed on the sheet. The sheet has a fixing end and an opposite free end. The fixing end is fixed on the base seat, the base seat and the fixing end clips the buffering pad. When the magnetic actuation is driven by the magnetic field to repeatedly move forward and backward with respect to the driving structure, the sheet repeatedly swings by the movement of the magnetic actuation.

15 Claims, 21 Drawing Sheets

Providing a heat dissipating device with a base seat, a buffering pad and a driving structure disposed on the base seat, and at least one swing structure spacedly arranged with the driving structure; wherein the driving structure has a core and a coil winding around the core, the swing structure has an elongated non-metal sheet and a magnetic actuation arranged corresponding to the core; the sheet includes a fixing end fixed on the base seat and an opposite free end; the buffering pad is arranged between the fixing end and the base seat; the sheet has a resonance frequency, which is changeable according to temperature ⸺ S110

Measuring a temperature value of the sheet corresponding to the resonance frequency by a temperature sensing module; ⸺ S120

Electrically connecting a current periodic controller to the temperature sensing module and the heat dissipating device, wherein the current periodic controller receives the temperature value and an external power for outputting a periodic power, and the current periodic controller adjusts a frequency of the periodic power to match the resonance frequency according to the temperature value, and then the periodic power drives the heat dissipating device. ⸺ S130

FIG.1

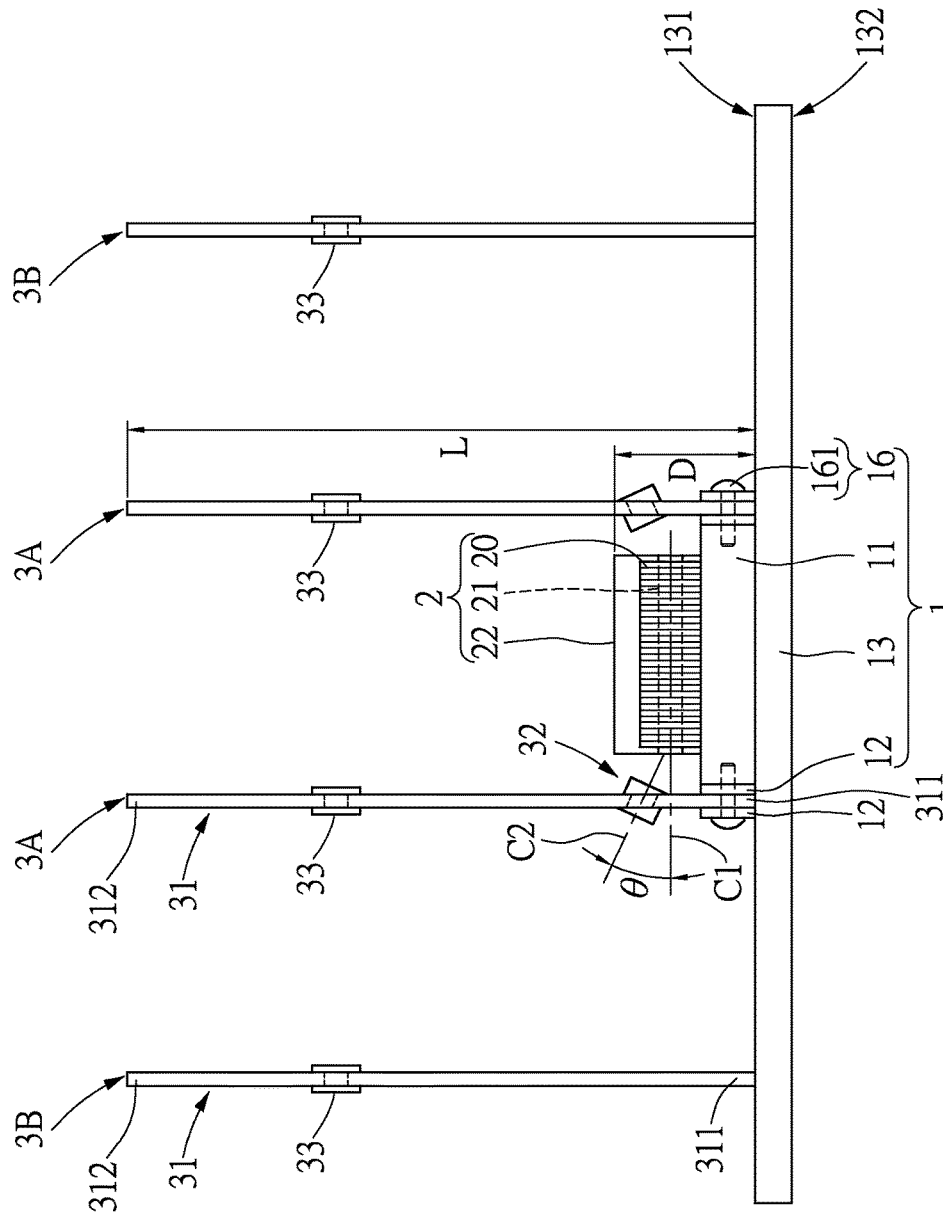

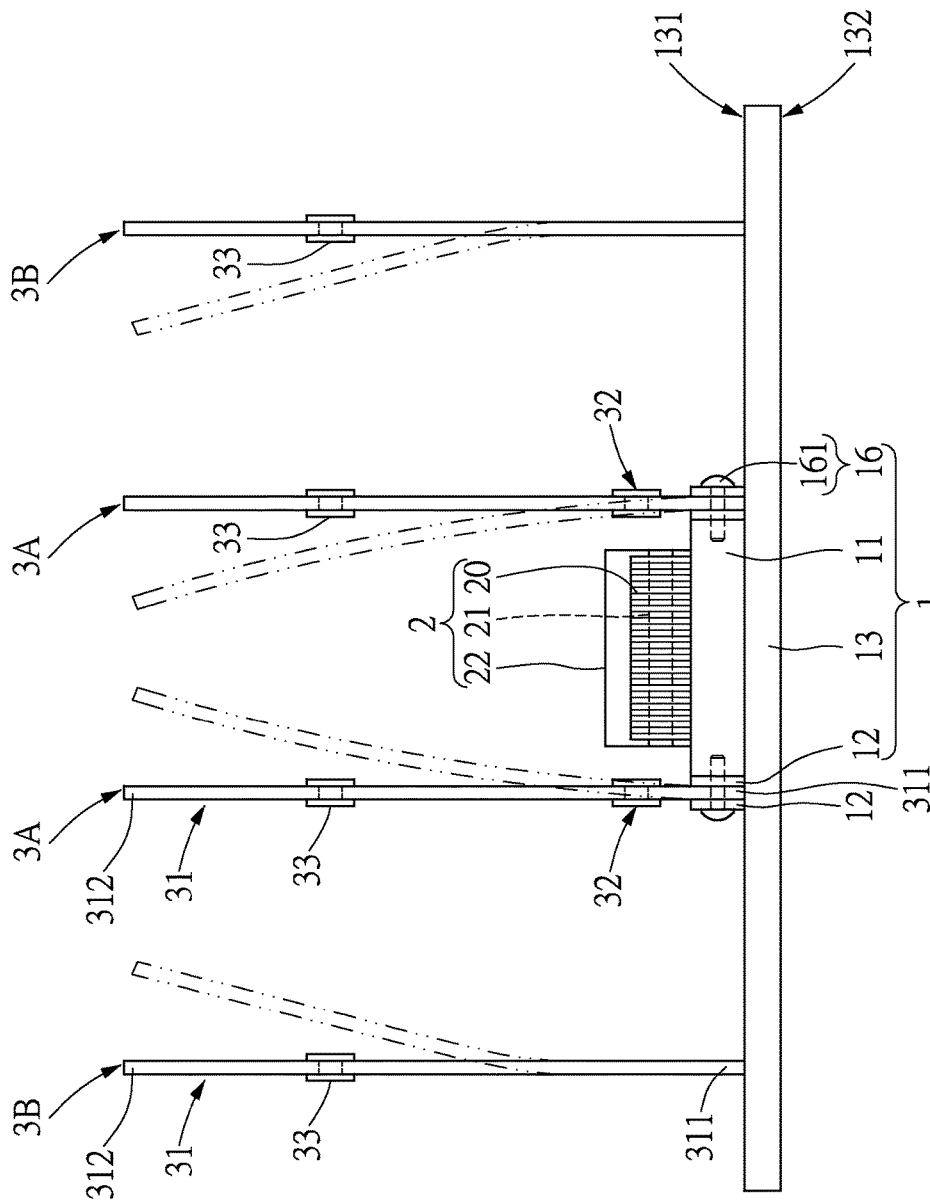

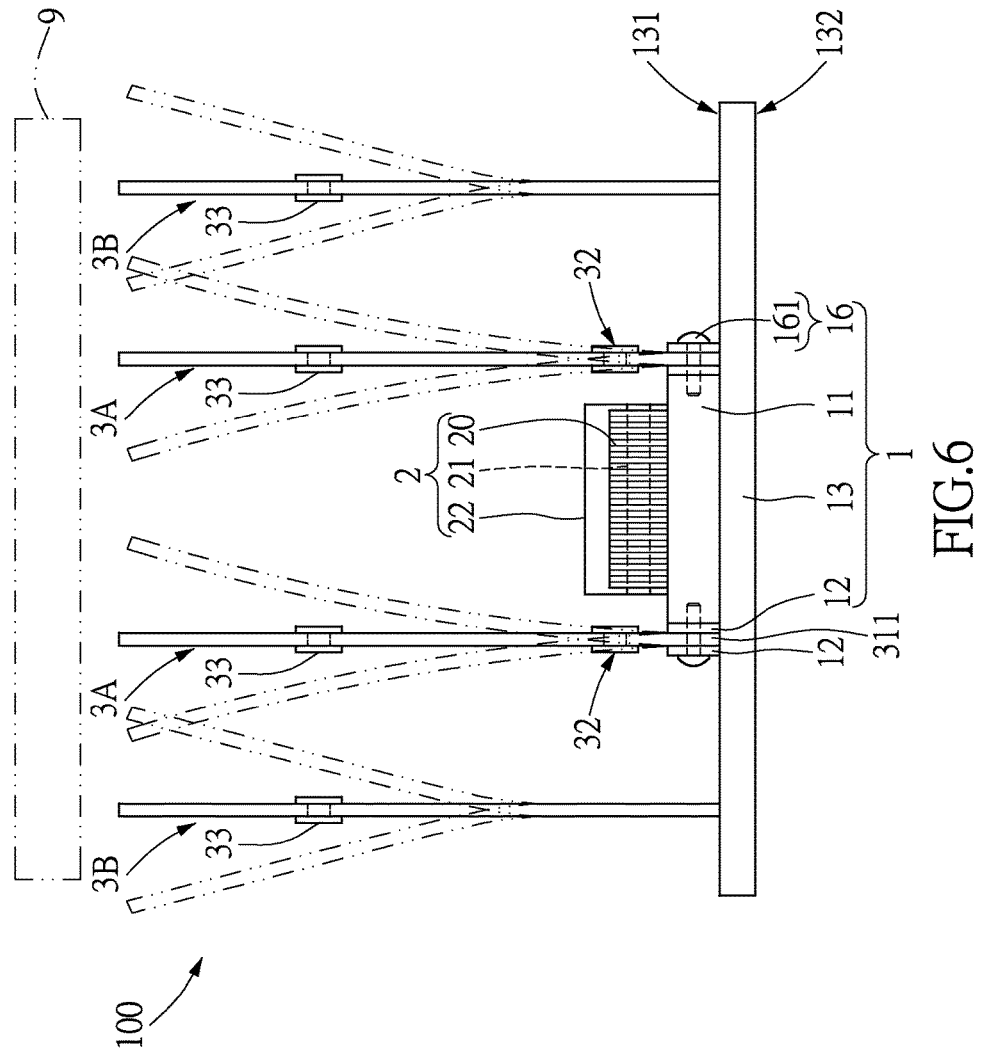

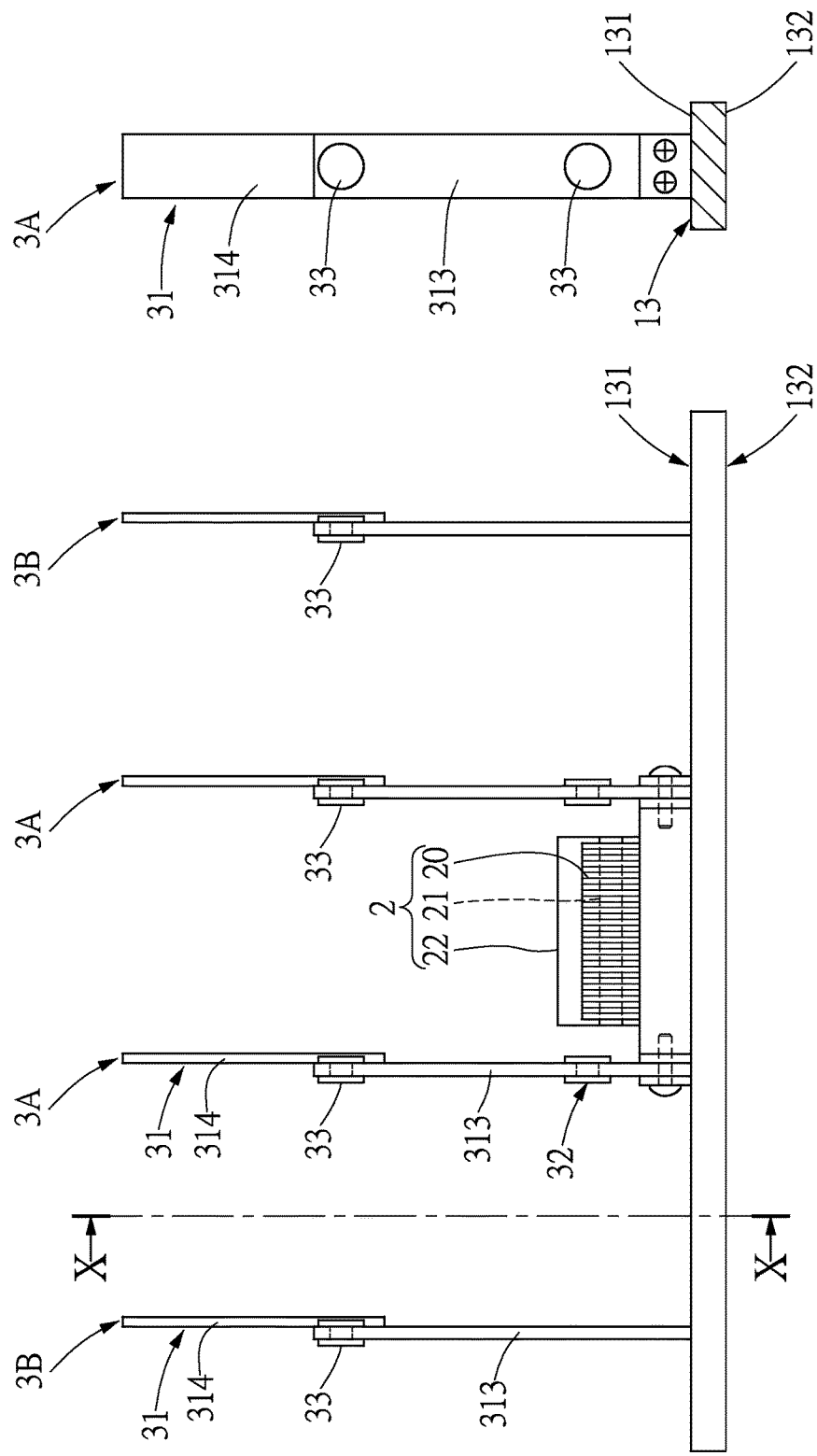

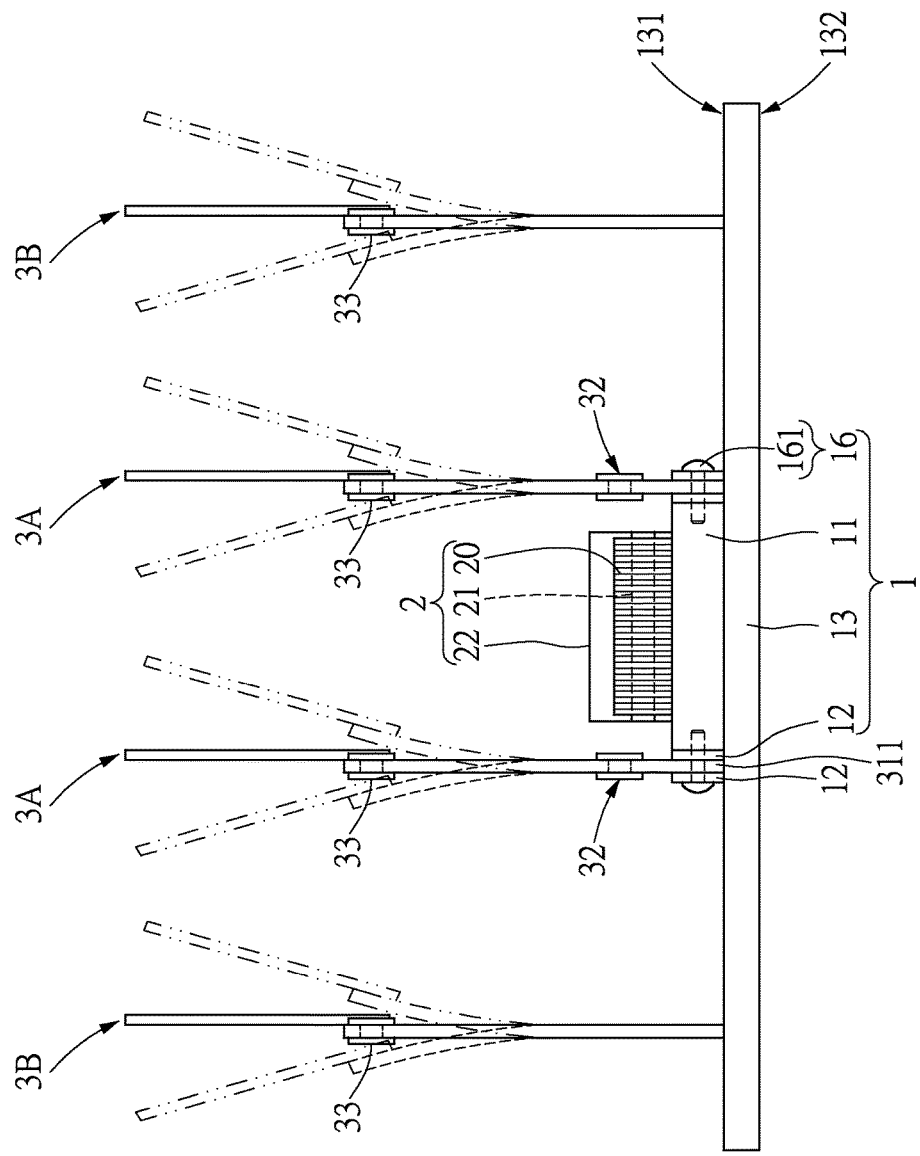

HEAT DISSIPATING SYSTEM

BACKGROUND OF THE INVENTION

1. Field of the Invention

The instant invention relates to a heat dissipating system; in particular, to a heat dissipating system provided with a swing structure.

2. Description of Related Art

With the rapid development of electronic products, whether laptop, desktop, or tablet, etc., compared to the past, the effectiveness of the central processor and other electronic components had great improvement. However, if the volume of the electronic component is unchanged or decreased, the heat generated from an operating electronic component (e.g., heat generating member) will increase. If heat cannot dissipate effectively, heat will cause the electronic component to have high temperature, which influences the operation of the electronic component. For example, heat usually causes thermal shutdown of a heat generating member. The conventional solution is disposing a heat dissipating fan on a heat generating member, thereby reducing the temperature of the heat generating member.

Moreover, the size of a conventional heat dissipating fan is unchanged, so the conventional heat dissipating fan cannot entirely align with each kind of heat generating member, thus part of the heat generating member is not arranged in a heat dissipating area defined by the conventional heat dissipating fan. In other words, the heat dissipating fan is not easily customized. In addition, the heat dissipating fan provided with a stable useful life is one of the industry's major concerns.

SUMMARY OF THE INVENTION

The instant disclosure provides a heat dissipating system for effectively improving the problem generated by the conventional heat dissipating fan.

The instant disclosure provides the heat dissipating system comprising a heat dissipating device, the heat dissipating device comprising: a carrying structure having a base seat and at least one buffering pad disposed on the base seat; a driving structure disposed on the base seat and having a core and a coil winding around the core, wherein the driving structure is configured to generate a magnetic field having cyclical changes by receiving a periodic power; and at least one swing structure having an elongated non-metal sheet and a magnetic actuation disposed on the sheet, the position of the magnetic actuation corresponding to the position of the core; wherein the sheet has a fixing end and an opposite free end, the fixing end of the sheet is fixed on the base seat, and the buffering pad is arranged between the fixing end of the sheet and the base seat; wherein the magnetic actuation is configured to be driven by the magnetic field to repeatedly move forward and backward with respect to the driving structure, thus the sheet is enabled to repeatedly swing by the movement of the magnetic actuation.

In summary, the heat dissipating system of the instant disclosure is provided with a heat dissipating device which can be customized according to different heat generating members. Moreover, the sheet of each swing structure is formed of non-metal material and is installed with at least one buffering pad to prevent a stress concentration problem from occurring to each sheet, thus the useful life of the sheet of each swing structure is increased and stable.

In order to further appreciate the characteristics and technical contents of the instant invention, references are hereunder made to the detailed descriptions and appended drawings in connection with the instant invention. However, the appended drawings are merely shown for exemplary purposes, rather than being used to restrict the scope of the instant invention.

BRIEF DESCRIPTION OF THE DRAWINGS

FIG. 1 is a step flowchart showing a power frequency compensation method for a heat dissipating device according to the instant disclosure;

FIG. 2F is a perspective view showing the magnetic actuation installed on the sheet according to another embodiment;

FIG. 3C is a perspective view showing the operation of the auxiliary swing structure;

FIG. 6 is a perspective view showing the heat dissipating device of the first embodiment applied to a shorter heat generating member;

FIG. 7 is a perspective view showing a heat dissipating device according to a second embodiment of the instant disclosure;

FIG. 8 is a cross-sectional view of FIG. 7 along line X-X;

FIG. 9 is a perspective view showing the operation of the heat dissipating device of the second embodiment;

DETAILED DESCRIPTION OF THE PREFERRED EMBODIMENTS

Please refer to FIGS. 1 through 6, which show a first embodiment of the instant disclosure. References are hereunder made to the detailed descriptions and appended drawings in connection with the instant invention. However, the appended drawings are merely shown for exemplary purposes, rather than being used to restrict the scope of the instant invention.

The instant disclosure provides a power frequency compensation method for a heat dissipating device 100, the heat dissipating device 100 has some specific requirements (e.g., heat dissipation by a swing structure) applied to the method. In order to clearly explain the power frequency compensation method, the following description firstly discloses the construction and operation of the heat dissipating device 100.

Figure 2A:
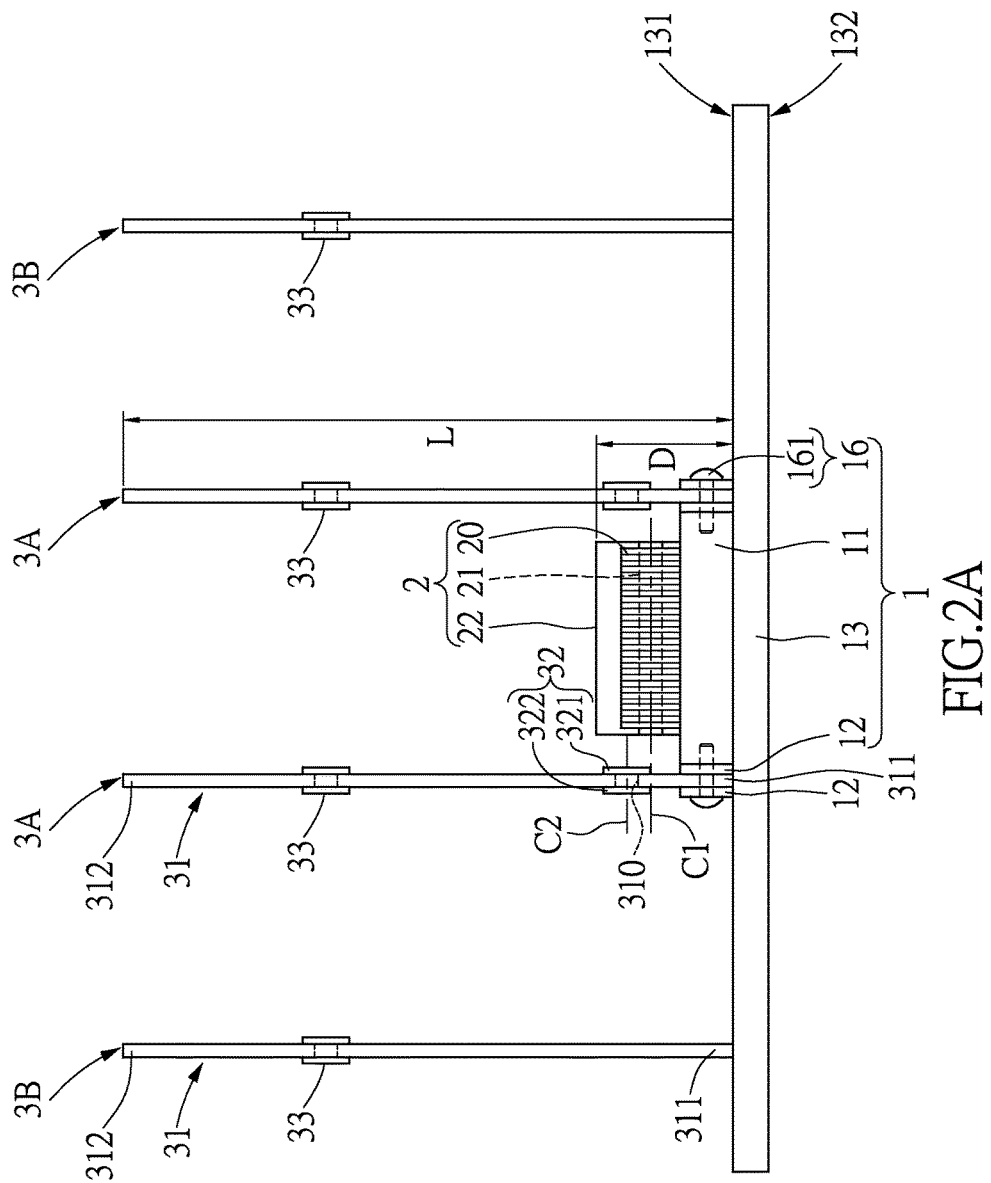
FIG. 2A is a perspective view showing a heat dissipating device according to a first embodiment of the instant disclosure.
Figure 4:
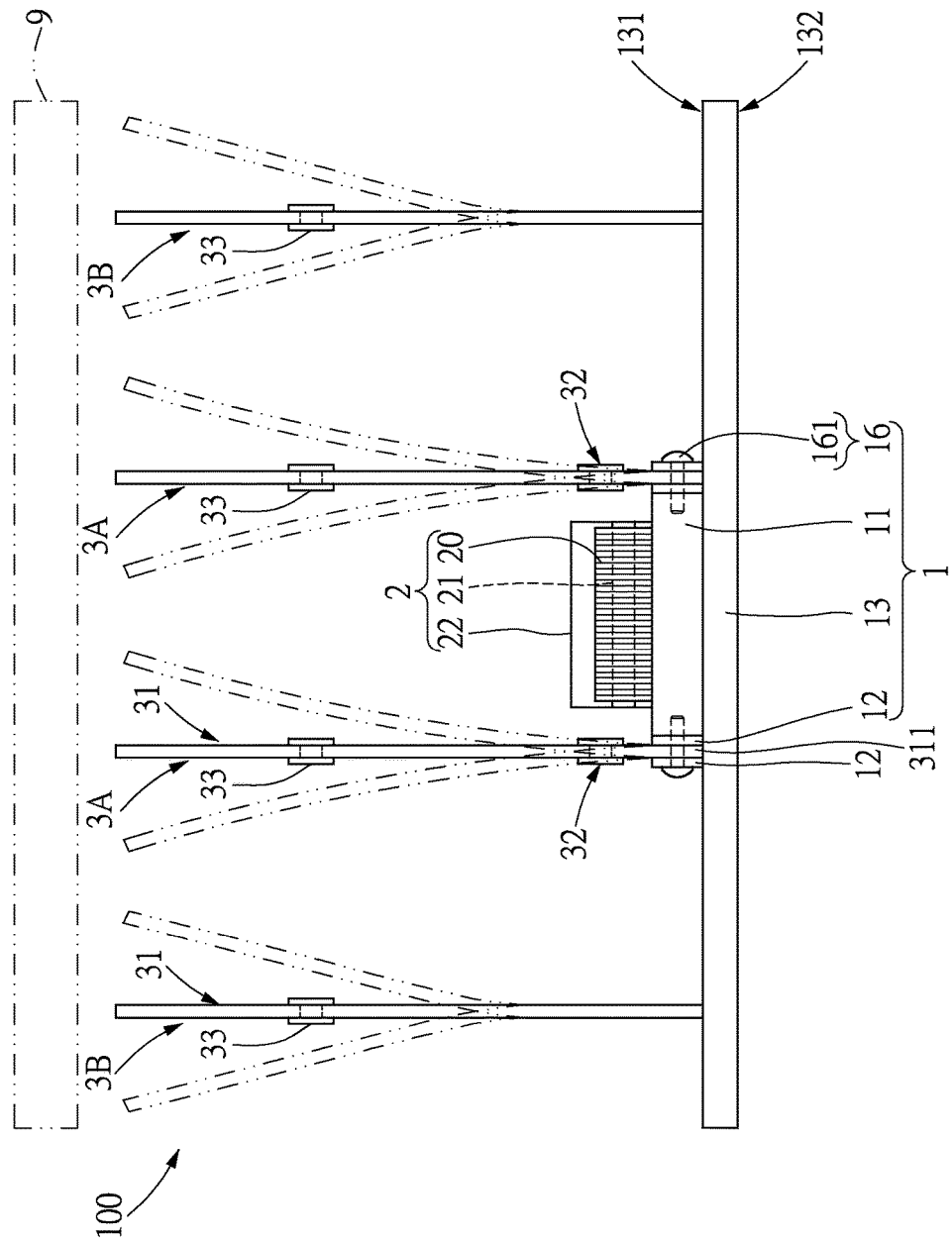
FIG. 4 is a perspective view showing the heat dissipating device of the first embodiment applied to at least one heat generating member.

Please refer to FIG. 2A. The heat dissipating device 100 of the first embodiment of the instant disclosure is used for dissipating heat, which is generated from at least one heat generating member 9 (as shown in FIG. 4). The heat dissipating device 100 includes a carrying structure 1, a driving structure 2, two swing structures 3A, and two auxiliary swing structures 3B.

The carrying structure 1 includes a base seat 11 having a substantially rectangular construction, a plurality of buffering pads 12 respectively disposed on two opposite sides of the base seat 11, and a substrate 13. The substrate 13 has a first surface 131 and an opposite second surface 132. The base seat 11 is fixed on the first surface 131 of the substrate 13. The driving structure 2 is disposed on the base seat 1 and includes a core 21, a coil 20 winding around the core 21 for receiving a periodic power, and a frame 22 supporting the core 21. The coil 20 is electrically connected to a power supply (not shown), which provides the periodic power. The periodic power can be periodic square wave, periodic triangle wave, periodic sine wave, or the positive and negative half-cycle period of alternating current. The periodic power in the instant embodiment is the positive and negative half-cycle period of alternating current as an example. When current outputted from the power supply travels in the coil 20, the core 21 and the coil 20 generate a magnetic field, and a direction of the magnetic field will repeatedly change over time. The core 21 in the instant embodiment is an iron core.

Figure 2B:
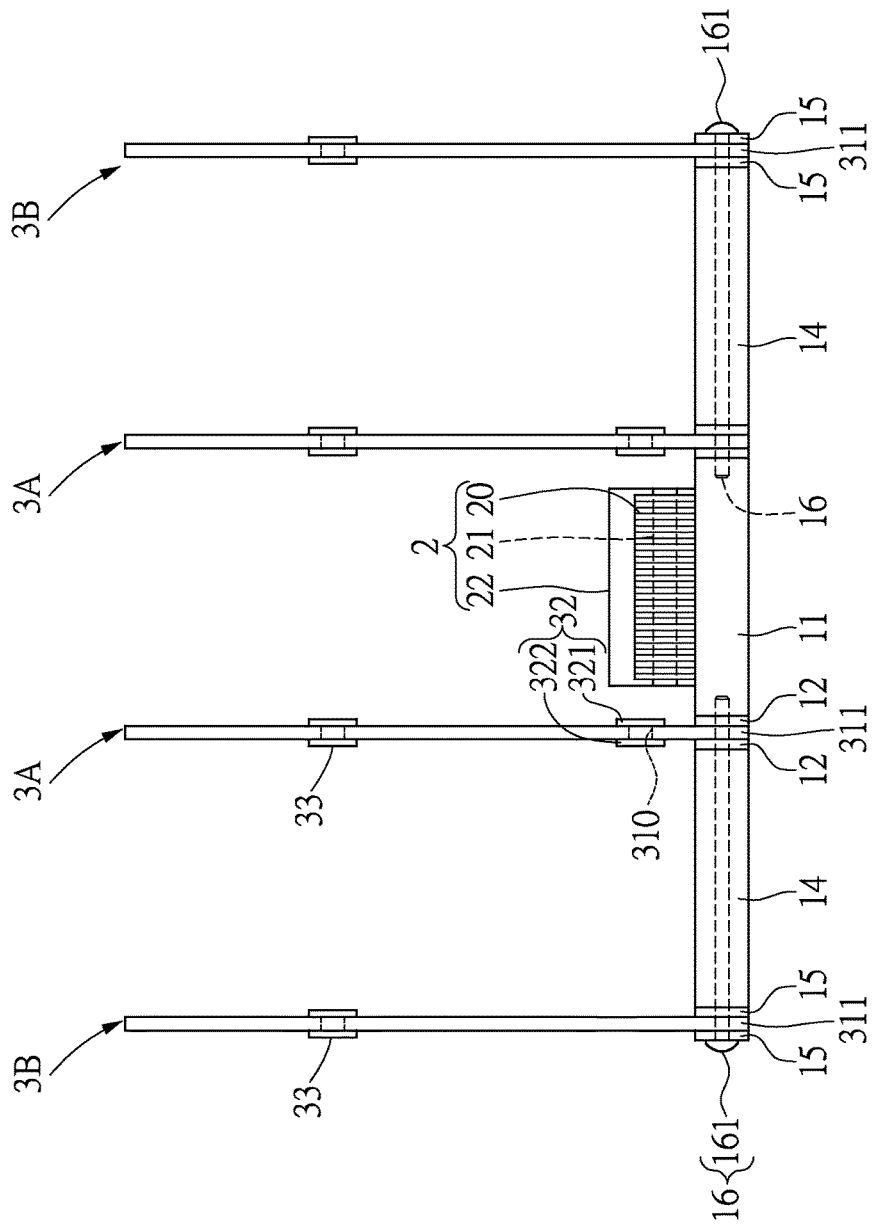
FIG. 2B is a perspective view showing the heat dissipating device in another embodiment.
Figure 2C:
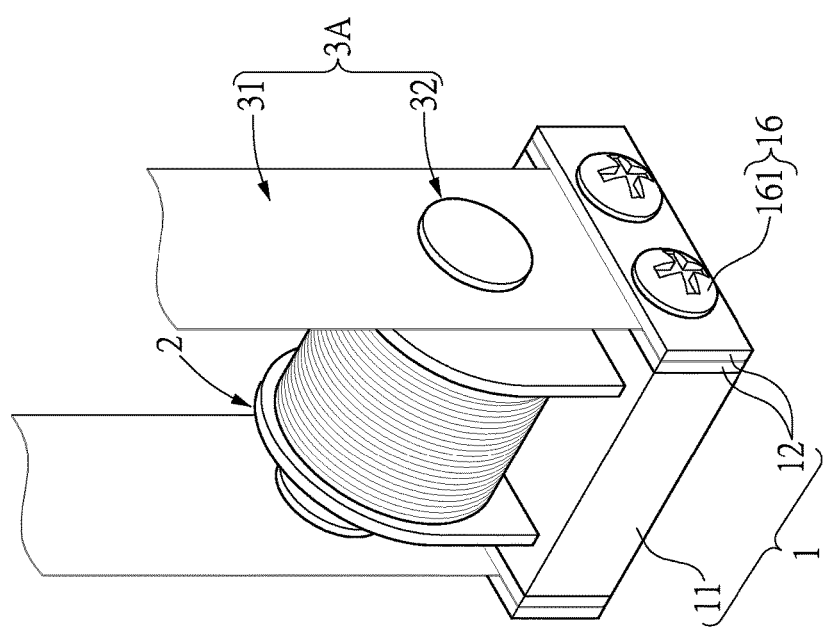
FIG. 2C is a perspective view showing part of the heat dissipating device.
Figure 2D:
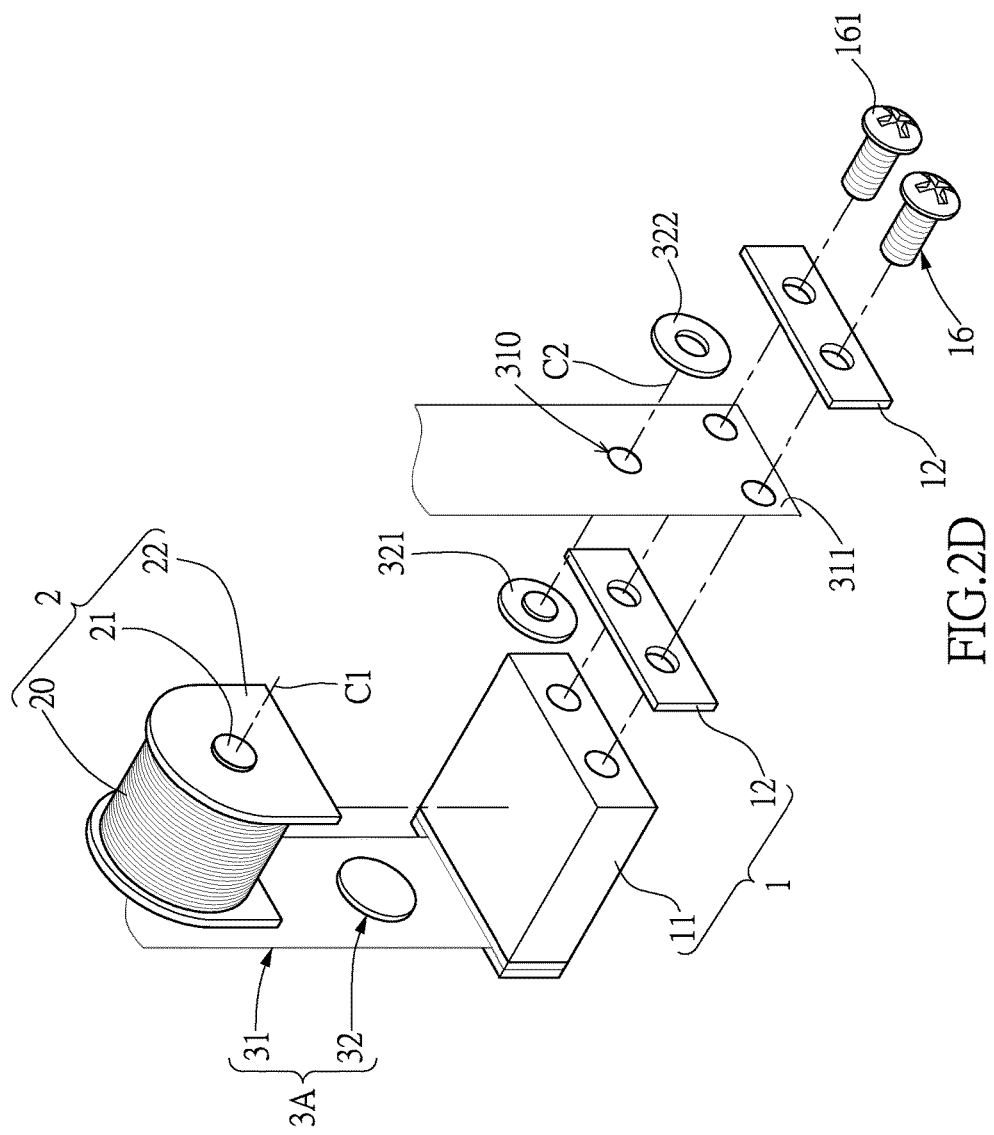
FIG. 2D is an exploded view of FIG. 2C.
Figure 2E:
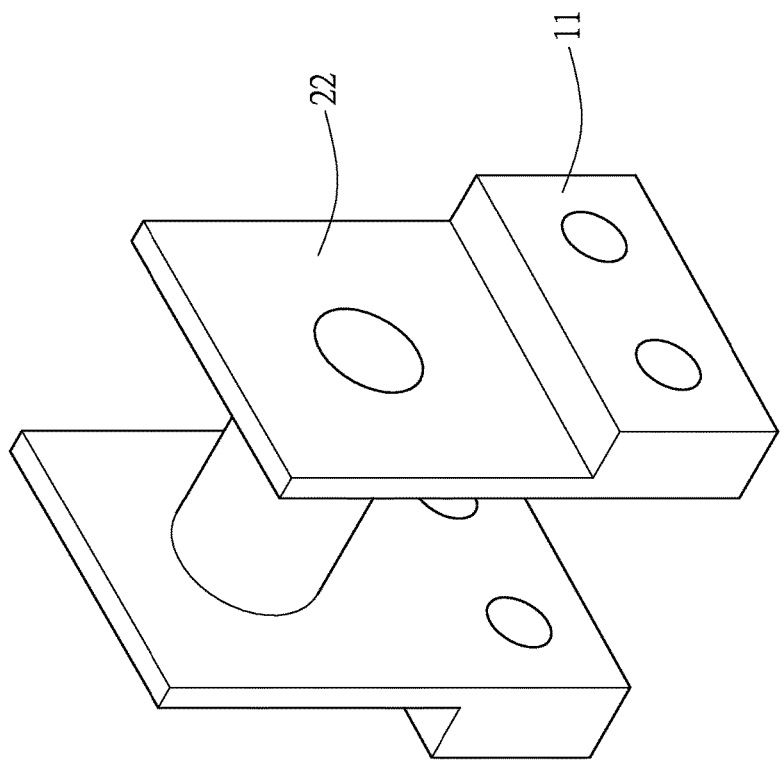
FIG. 2E is a perspective view showing a construction of the base seat and the frame integrally formed in one piece.

In addition, the base seat 11 and the frame 22 can be formed by injection molding manner, such that the base seat 11 and the frame 22 are integrally formed in one piece (as shown in FIG. 2E) for reducing the manufacturing cost of the heat dissipating device 100.

Each one of the two swing structures 3A and the two auxiliary swing structures 3B has a resilient property. The two swing structures 3A are respectively arranged on two opposite sides of the driving structure 2, the two auxiliary swing structures 3B are arranged on two opposite sides of the swing structures 3A, and the auxiliary swing structures 3B are respectively arranged apart from the swing structures 3A. That is to say, the swing structures 3A are closer to the driving structure 2 than the auxiliary swing structures 3B. In addition, a vertical distance D between the top edge of the driving structure 2 and the first surface 131 of the substrate 13 is smaller than or identical to one third of the length L of each swing structure 3A, thus each swing structure 3A has a preferred swinging range.

Moreover, each swing structure 3A is substantially identical to each auxiliary swing structure 3B, and they only have a slight difference in construction detail. Each one of the swing structure 3A and the auxiliary swing structure 3B has an elongated non-metal sheet 31, and each sheet 31 has a fixing end 311 disposed on the base seat 1 and an opposite free end 312.

The material of the sheets 31 of the swing structure 3A and the auxiliary swing structure 3B can be plastic, resin, wood (e.g., balsa wood), carbon fiber, or paperboard, but the material of each sheet 31 is not limited thereto. The reason for each sheet 31 in the instant embodiment being formed by non-metal material is disclosed as follows: if the heat dissipating device 100 uses a metal sheet, metal sheet fatigue easily occurs to influence operating efficiency after swinging for a period of time, thus the heat dissipating device 100 in the instant embodiment does not use any metal sheet because of the shorter using life of a metal sheet.

The following description discloses the difference between the swing structure 3A and the auxiliary swing structure 3B. Each swing structure 3A has a magnetic actuation 32 disposed on the sheet 31 thereof and a swing magnetic member 33 disposed on the sheet 31 thereof, the position of the magnetic actuation 32 corresponds to the position of the core 21 of the driving structure 2, and the swing magnetic member 33 is arranged apart from the magnetic actuation 32. Each auxiliary swing structure 3B has a swing magnetic member 33 disposed on the sheet 31 thereof, and the position of the swing magnetic member 33 of the auxiliary swing structure 3B corresponds to the swing magnetic member 33 of the swing structure 3A. The position of the four swing magnetic members 33 are arranged further away from the base seat 1 than the two magnetic actuations 32. Each one of the magnetic actuations 32 and the swing magnetic members 33 has a magnetic field, and each one of the magnetic actuations 32 and the swing magnetic members 33 in the instant embodiment is a permanent magnet. Moreover, the magnetic pole of the swing magnetic member 33 of each swing structure 3A is identical to the magnetic pole of the swing magnetic member 33 of the adjacent auxiliary swing structure 3B for generating a repulsing force therebetween.

Specifically, as shown in FIGS. 2A, 2C, and 2D, the fixing end 311 of the sheet 31 of each swing structure 3A is fixed on the base seat 11, and the fixing end 311 of the sheet 31 of each swing structure 3A and the base seat 11 clip to one buffering pad 12, such that the fixing end 311 of each sheet 31 does not directly contact the base seat 11 for preventing a stress concentration problem from occurring to each sheet 31, which may result from the base seat 11. Each swing structure 3A of the instant embodiment uses a screw 16 to pass through the fixing end 311 and to couple through the base seat 11 for fixing the sheet 31 on the base seat 11, and one buffering pad 12 is disposed on a surface of the fixing end 311 of the sheet 31 of the swing structure 3A away from the base seat 11, thereby the fixing end 311 of the sheet 31 of each swing structure 3A and a head portion 161 of the corresponding screw 16 clip the corresponding buffering pad 12 to prevent a stress concentration problem from occurring to each sheet 31, which may result from the head portion 161 of the corresponding screw 16.

Moreover, the fixing end 311 of the sheet 31 of each auxiliary swing structure 3B is directly fixed on the substrate 13, but is not limited thereto. For example, as shown in FIG. 2B, the carrying structure 1 can be provided without the substrate 13, and the carrying structure 1 can further include two auxiliary seats 14 and a plurality of auxiliary buffering pads 15 respectively disposed on one side of the auxiliary seats 14. The carrying structure 1 uses a screw 16 to pass through the auxiliary seat 14 for fixing the auxiliary seat 14 on the base seat 11, and each auxiliary seat 14 and the sheet 31 of the adjacent swing structure 3A clip one buffering pad 12, thereby preventing a stress concentration problem from occurring to each sheet 31, which may result from the auxiliary seat 14.

Each auxiliary swing structure 3B uses a screw 16 to pass through the fixing end 311 thereof for fixing the sheet 31 on one end of the auxiliary seat 14 away from the base seat 11, and two auxiliary buffering pads 15 clip two opposite surfaces of the fixing end 311 of the sheet 31 of the auxiliary swing structure 3B. Thus, the fixing end 311 of the sheet 31 of each auxiliary swing structure 3B and the corresponding auxiliary seat 14 clip one auxiliary buffering pad 15, such that the fixing end 311 of the sheet 31 of each auxiliary swing structure 3B does not directly contact the corresponding auxiliary seat 14 to prevent a stress concentration problem from occurring to the sheet 31 of each auxiliary swing structure 3B, which may result from the corresponding auxiliary seat 14. Moreover, the fixing end 311 of the sheet 31 of each auxiliary swing structure 3B and a head portion 161 of the corresponding screw 16 clip the corresponding auxiliary buffering pad 15 to prevent a stress concentration problem from occurring to the sheet 31 of each auxiliary swing structure 3B, which may result from the head portion 161 of the corresponding screw 16.

As shown in FIGS. 2A, 2C, and 2D, each magnetic actuation 32 in the instant embodiment includes two magnets 321, 322 attracted to each other, and the two magnets 321, 322 are mounted on a portion of the sheet 31 of the swing structure 3A, which corresponds to a centerline C1 of the coil 20. The portion of the sheet 31 of the swing structure 3A, which corresponds to the centerline C1 of the coil 20, is defined as a positioning portion 310. A predetermined distance between a centerline of the positioning portion 310 and the centerline C1 of the coil 20 is smaller than or identical to a radius of the coil 20. The predetermined distance in the instant embodiment means the position of the magnetic actuation 32 corresponding to the position of the core 21 of the driving structure 2.

Specifically, the manner in which the magnets 321, 322 are mounted on the sheet 31 in the instant embodiment is disclosed as follows: the positioning portion 310 has a thru-hole, one of the magnets 321 partially couples through the thru-hole of the positioning portion 310 to engage with another magnet 322. In other words, the position of the magnetic actuation 32 corresponds to the position of the core 21 of the driving structure 2, the above relationship means: the centerline C2 of the magnetic actuation 32 is parallel to and higher than the centerline C1 of the coil 20, and a distance exists between the centerline C2 of the magnetic actuation 32 and the centerline C1 of the coil 20.

In addition, the manner in which the magnets 321, 322 are mounted on the sheet 31 can be implemented by respectively adhering the two magnets 321, 322 onto two opposite surfaces of the positioning portion 310 (not shown), but it is not limited thereto. The structural relationship between the swing magnetic member 33 and the corresponding portion of the sheet 31 can be identical to the magnetic actuation 32 and the positioning portion 310 of the sheet 31, so the instant embodiment does not disclose this again.

Moreover, the magnetic actuation 32 of the instant embodiment can be arranged as shown in FIG. 2F. Specifically, an angle θ between a centerline C2 of the magnetic actuation 32 and the centerline C1 of the coil 20 is smaller than or identical to five degrees. Thus, based on the above arrangement, the position of the magnetic actuation 32 can be adjusted according to the magnetic field generated from the driving structure 2, thereby a cooperative effect of the magnetic actuation 32 and the driving structure 2 can be better.

Figure 2G:
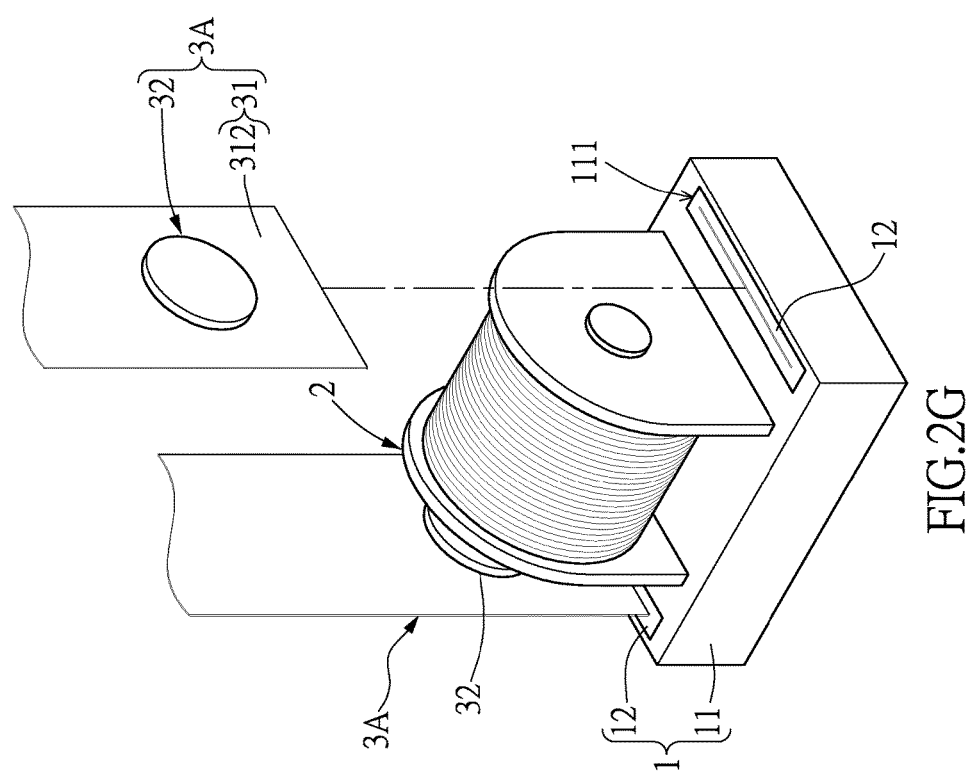
FIG. 2G is a perspective view showing the sheet fixed on the base seat by using at least one buffering pad.

Additionally, the instant disclosure provides a type shown in FIG. 2G. Specifically, the base seat 11 has two troughs 111 respectively formed on two opposite end portions thereof, and the fixing ends 311 of the two sheets 31 of the swing structures 3A are respectively inserted into the two troughs 111. Each trough 111 is filled with a solidified gel, which is defined as the buffering pad 12. That is to say, the fixing end 311 of the sheet 31 of the swing structure 3A is embedded in the buffering pad 12, so that the fixing end 311 of the sheet 31 of each swing structure 3A is fixed on the base seat 11 by using the corresponding buffering pad 12.

Moreover, as shown in FIG. 2G, the buffering pad 12 is not limited to the solidified gel. For example, the buffering pad 12 can be a solid sheet, and each trough 111 receives at least one buffering pad 12. The buffering pad 12 arranged in the trough 111 is bonded with the fixing end 311 of the sheet 31 of the swing structure 3A by using an adhesive, thereby the fixing end 311 of the sheet 31 of each swing structure 3A is fixed on the base seat 11 by using the corresponding buffering pad 12.

The following description discloses the operation of the heat dissipating device 100.

Please refer to FIG. 2A, which shows the coil 20 not receiving a periodic power or the periodic power is not provided. The driving structure 2 cannot drive the swing structures 3A, so the swing structures 3A and the auxiliary swing structures 3B cannot move, which defines an initial mode.

Figure 3A:
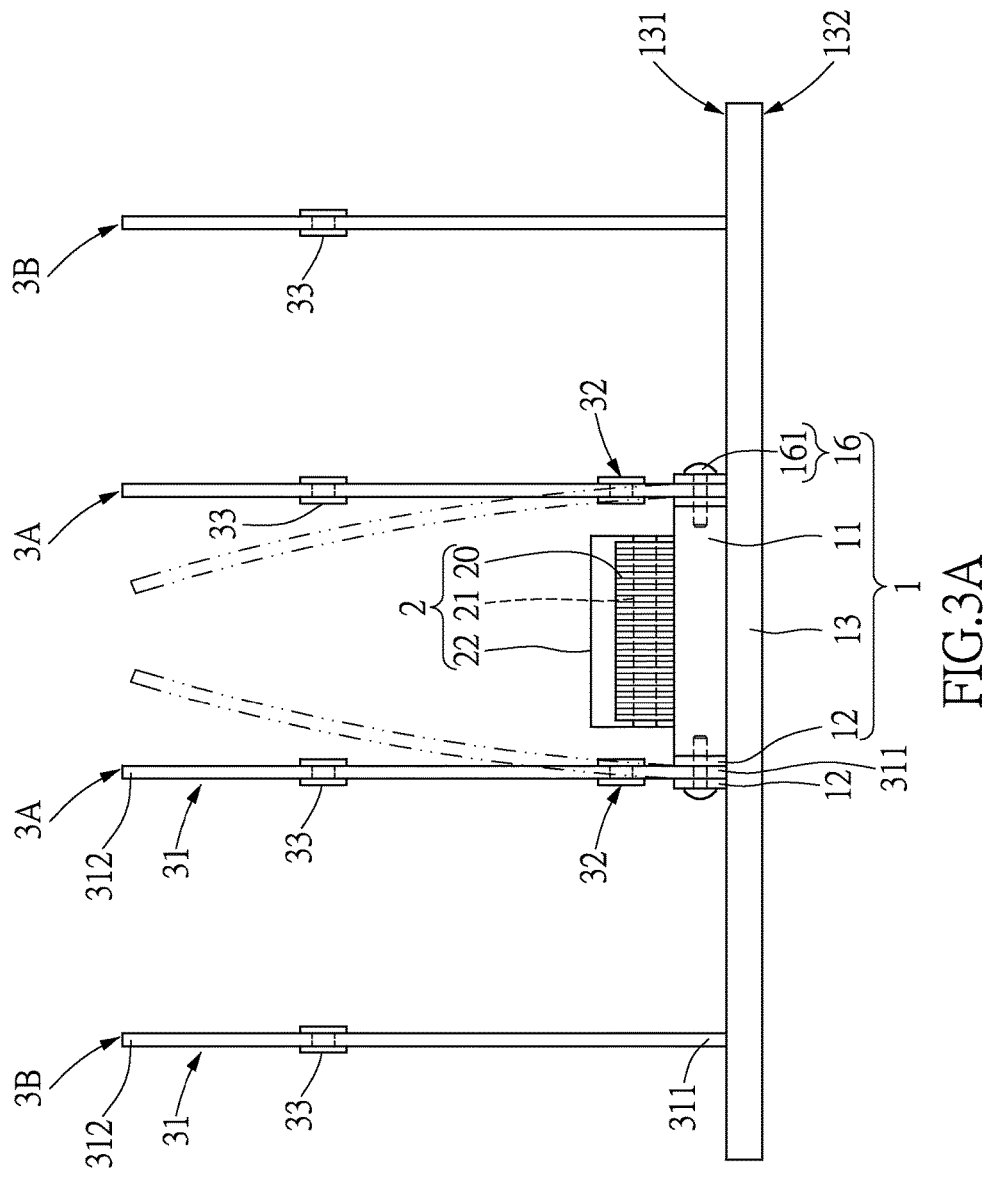
FIG. 3A is a perspective view showing the two magnetic actuations attracted to a magnetic field generated from the driving structure.
Figure 3B:
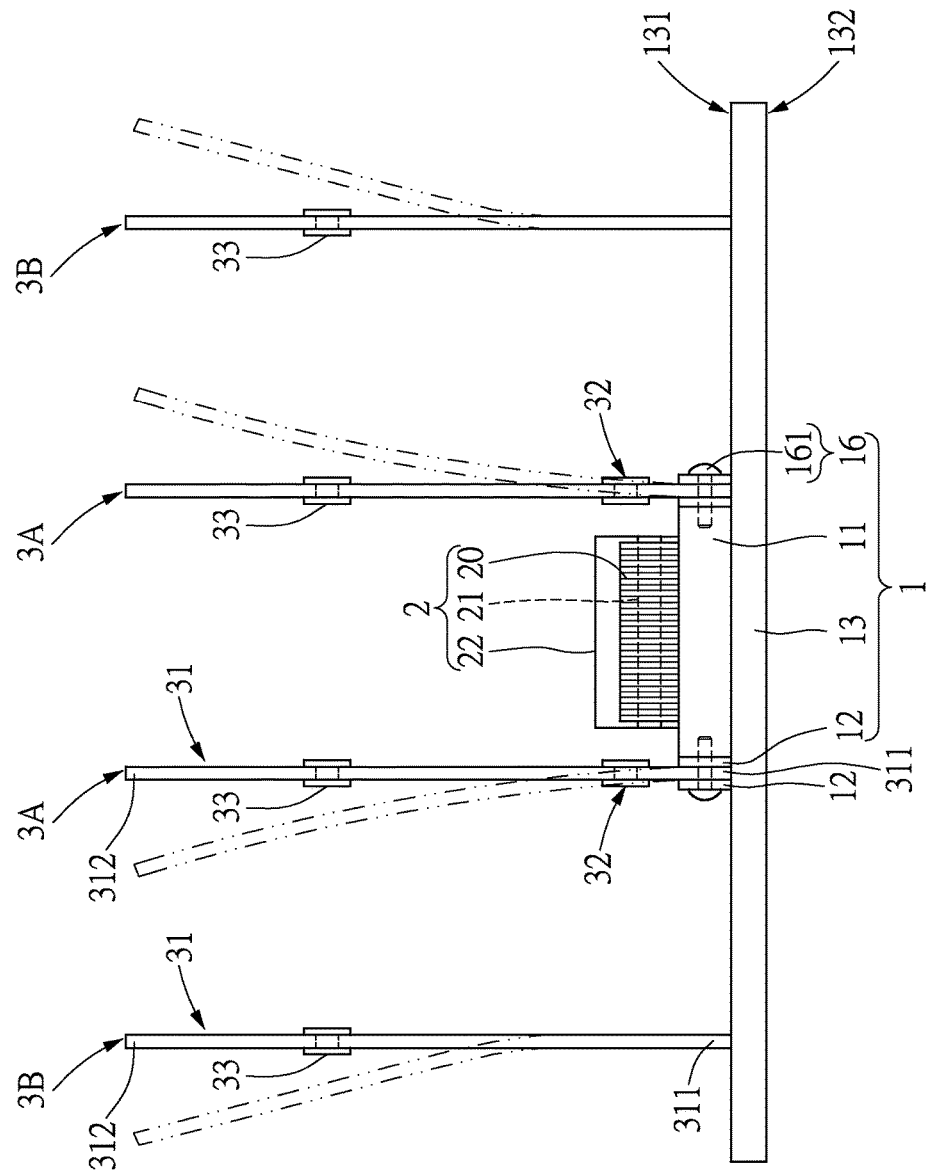
FIG. 3B is a perspective view showing the two magnetic actuations repulsed from a magnetic field generated from the driving structure.

Please refer to FIG. 3A through 4, which show a periodic power (e.g., positive and negative half-cycle period of alternating current) applied to the coil 20 of the driving structure 2. The driving structure 2 begins to generate a magnetic field, which has cyclical changes, so that the magnetic actuations 32 are attracted to or repulsed from the driving structure 2, thereby causing the magnetic actuations 32 to repeatedly move forward and backward with respect to the driving structure 2. As shown in FIG. 3A, when the magnetic actuations 32 are attracted to the magnetic field generated from the driving structure 2, the magnetic actuations 32 move toward the driving structure 2 to cause the free end 312 of the sheet 31 of each swing structure 3A to swing toward the driving structure 2. However, the swing magnetic members 33 of the swing structures 3A move away from the swing magnetic members 33 of the auxiliary swing structures 3B, so the auxiliary swing structures 3B cannot be driven to swing. As shown in FIG. 3B, when the magnetic actuations 32 are repulsed from the magnetic field generated from the driving structure 2, the magnetic actuations 32 move away from the driving structure 2 to cause the free end 312 of the sheet 31 of each swing structure 3A to swing away from the driving structure 2. Based on the magnetic pole of the swing magnetic member 33 of each swing structure 3A being identical to the magnetic pole of the swing magnetic member 33 of the adjacent auxiliary swing structure 3B, a repulsing force there-between drives the sheet 31 of each auxiliary swing structure 3B to swing away from the corresponding swing structure 3A, and each auxiliary swing structure 3B has a resilient property which stores an elastic force. As shown in FIG. 3C, when the magnetic actuations 32 are attracted to the magnetic field generated from the driving structure 2, the free end 312 of the sheet 31 of each swing structure 3A swings toward the driving structure 2, so the repulsing force disappears to cause each auxiliary swing structure 3B to release the elastic force, thereby the sheet 31 of each auxiliary swing structure 3B swings toward the corresponding swing structure 3A. In other words, as shown in FIG. 4, the sheets 31 of the swing structures 3A and the auxiliary swing structures 3B repeatedly swing according to the different magnetic fields generated from the driving structure 2. Specifically, the magnetic actuations 32 are driven to repeatedly move forward and backward with respect to the driving structure 2 by the repeatedly changing magnetic field, such that the sheet 31 of each swing structure 3A repeatedly swings by the movement of the corresponding magnetic actuation 32, and the sheet 31 of each auxiliary swing structure 3B is driven to repeatedly swing by the corresponding swing magnetic members 33.

Please refer to FIG. 4, which shows the heat dissipating device 100 of the instant embodiment used for dissipating heat generated from at least one heat generating member 9. The heat generating member 9 can be arranged close to the free ends 312 of the swing structures 3A and the auxiliary swing structures 3B, and the swing structures 3A and the auxiliary swing structures 3B repeatedly swing to generate an air flow to the heat generating member 9, thereby dissipating heat.

The heat dissipating device 100 can be adjusted for heat generating members 9 of different size. Please refer to FIG. 5, which shows a heat generating member 9 having a longer shape. The heat dissipating device 100 increases the number of the auxiliary swing structures 3B or increases the distance between the swing structures 3A and the auxiliary swing structures 3B. Please refer to FIG. 6, which shows a heat generating member 9 having a shorter shape. The heat dissipating device 100 decreases the number of the auxiliary swing structures 3B or decreases the distance between the swing structures 3A and the auxiliary swing structures 3B. Thus, the heat dissipating device 100 can be customized according to different heat generating member 9.

Please refer to FIGS. 7 through 9, which show the heat dissipating device 100 according to a second embodiment. The second embodiment is similar to the first embodiment, and the difference between the two embodiments is the construction of the sheets 31 of the swing structures 3A and the auxiliary swing structures 3B. Each sheet 31 has a first segment 313 disposed on the first surface 11 of the base seat 1 and a second segment 314 connected to the first segment 313, and the second segment 314 is arranged away from the base seat 1. Each one of the magnetic actuations 32 and the swing magnetic members 33 is disposed on the corresponding first segment 313. Preferably, each swing magnetic member 33 can be disposed on the connecting portion of the first segment 313 and the second segment 314, but is not limited thereto. For example, each swing magnetic member 33 can be disposed above the connecting portion of the first segment 313 and the second segment 314 (i.e., disposed on the second segment 314), or each swing magnetic member 33 can be disposed under the connecting portion of the first segment 313 and the second segment 314 (i.e., disposed on the first segment 313).

The material of each one of the first segments 313 and the second segments 314 can be plastic, resin, wood (e.g., balsa wood), or carbon fiber, and the material of each second segment 314 can be paperboard. About the physical property, a Young's modulus of each first segment 313 is greater than a Young's modulus of the connected second segment 314. Generally, the length of each segment 313 is preferably greater than the length of the corresponding second segment 314, and the proportion between each first segment 313 and the corresponding second segment 314 can be adjusted according to a size of an installation space.

Figure 5:
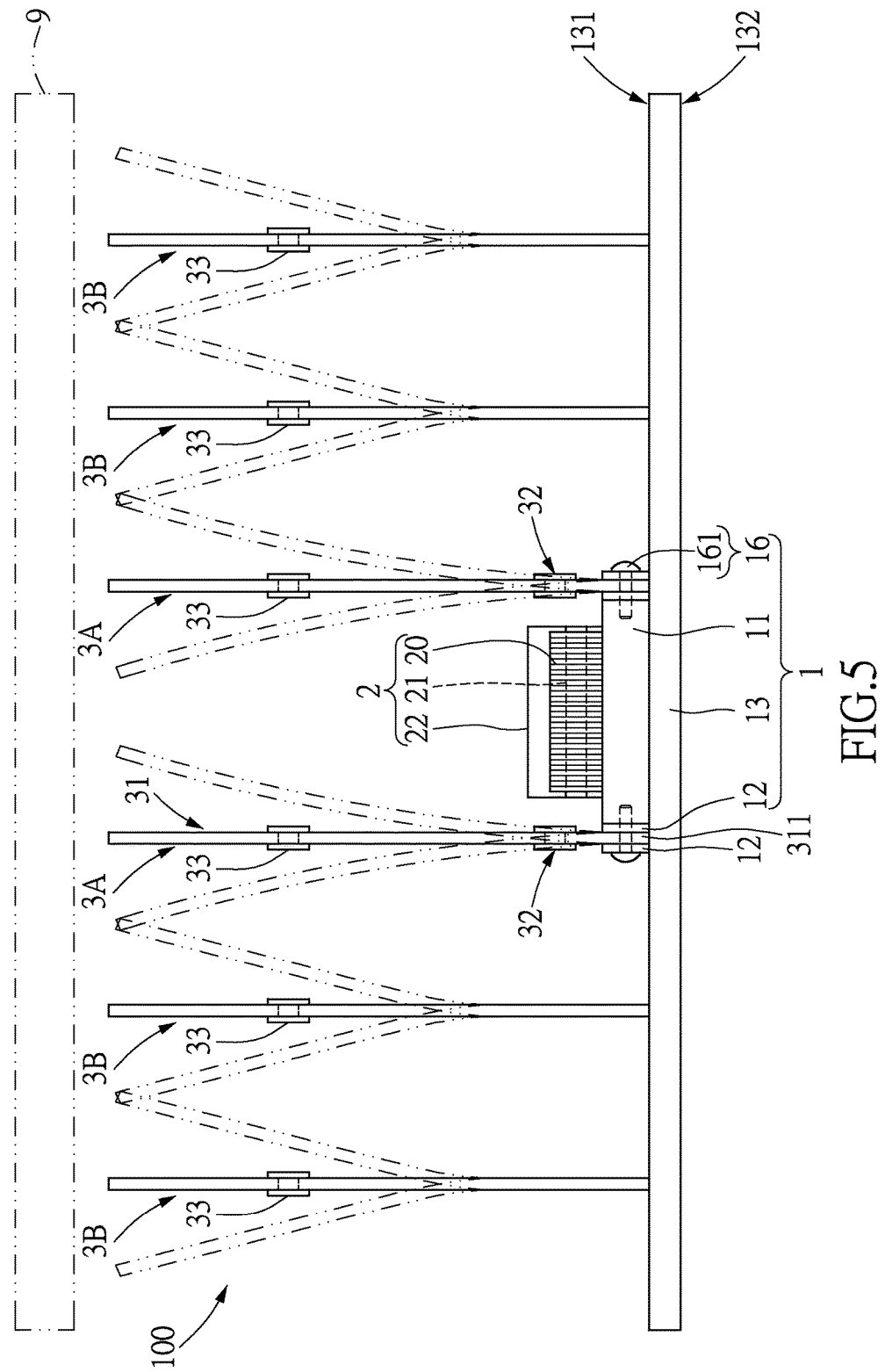
FIG. 5 is a perspective view showing the heat dissipating device of the first embodiment applied to a longer heat generating member.

The operation of the second embodiment is similar to the operation of the first embodiment, so the operation of the second embodiment is not disclosed again. As shown in FIG. 5, based on the cantilever swing theory, each first segment 313 and the connected second segment 314 have a swinging range in a positive correlation with the Young's modulus thereof, and each first segment 313 and the connected second segment 314 have a swinging frequency in a negative correlation with the Young's modulus thereof. The swinging range and the swinging frequency also have other influence factors. When the other influence factors are not changed, each first segment 313 has a faster swinging frequency and each second segment 314 has a larger swinging range based on the Young's modulus of each first segment 313 greater than the Young's modulus of the connected second segment 314. Each first segment 313 can drive the connected second segment 314 to move, so that when the swinging frequency of each first segment 313 is increased, the swinging frequency of the connected second segment 314 will be increased. Moreover, each second segment 314 has a larger swinging range so as to generate a strong air flow, thereby achieving good heat dissipating effect. Preferably, the Young's modulus of each first segment 313 is greater than the Young's modulus of the connected second segment 314, and the density of each first segment 313 is smaller than the density of the connected second segment 314. Moreover, if the Young's modulus and the density are considered and the other influence factors are not changed, the preferable material of each segment 313 is carbon fiber, and the preferable material of each second segment 314 is polyester film.

Figure 10:
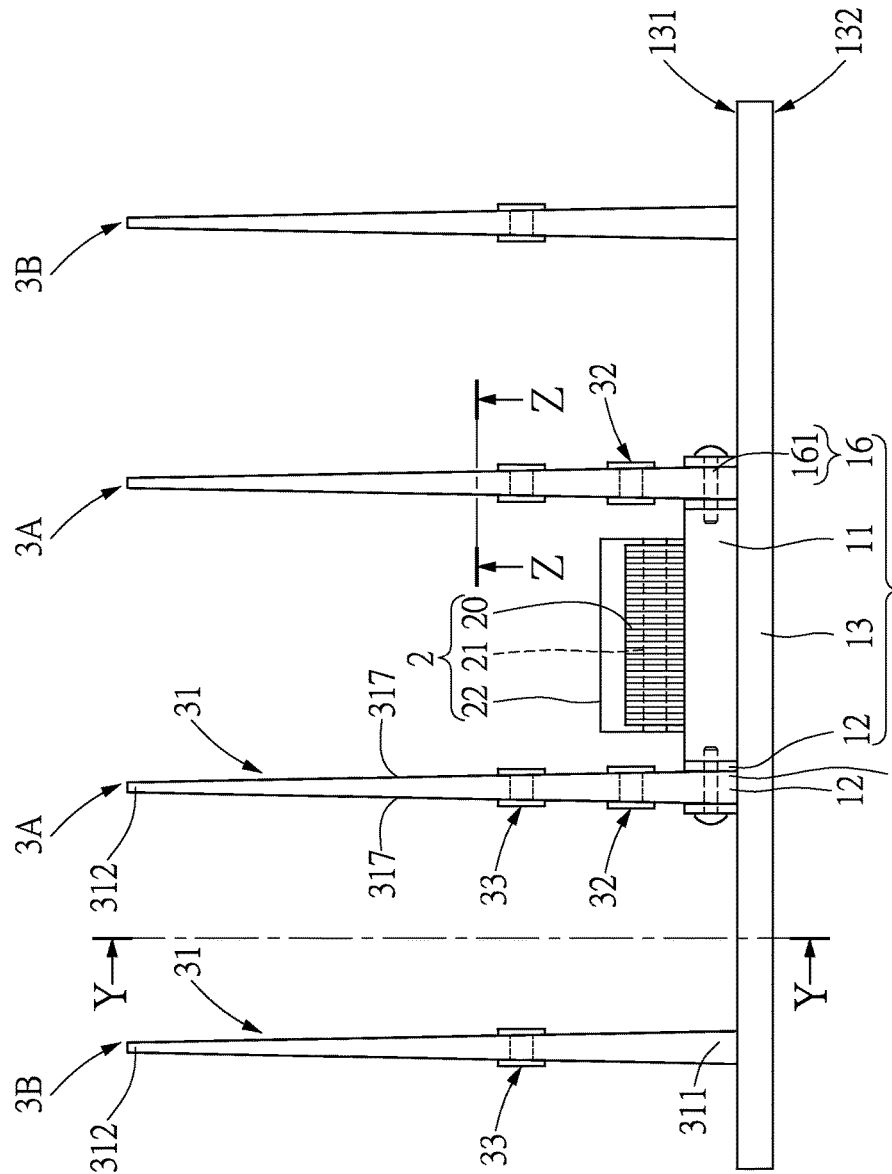
FIG. 10 is a perspective view showing a heat dissipating device according to a third embodiment of the instant disclosure.
Figure 12:
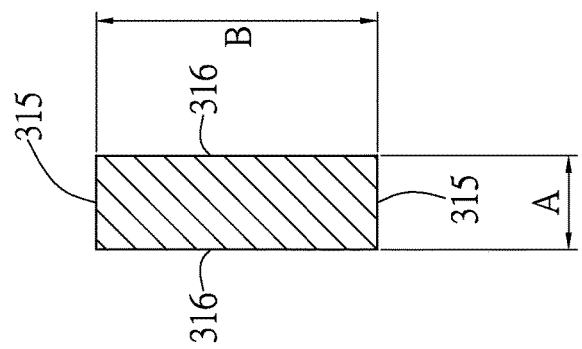
FIG. 12 is a cross-sectional view of FIG. 10 along line Z-Z.
Figure 11:
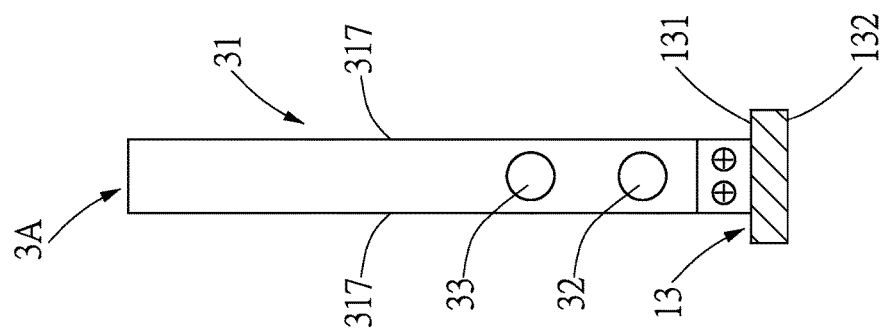
FIG. 11 is a cross-sectional view of FIG. 10 along line Y-Y.

Please refer to FIGS. 10 through 12, which show the heat dissipating device 100 according to a third embodiment. The third embodiment is similar to the first embodiment, and difference between the two embodiments is the construction of the sheets 31 of the swing structures 3A and the auxiliary swing structures 3B. The volume of each sheet 31 gradually reduces in a direction away from the base seat 1, that is to say, each sheet 31 is tapered away from the base seat 1. In other words, each sheet 31 has a cross-sectional area perpendicular to a longitudinal direction thereof, and the cross-sectional area of each sheet 31 gradually reduces from the fixing end 311 to the free end 312. The cross-section of each sheet 31 has two parallel side edges 315 and two parallel connecting edges 316 connected to the side edges 315. Each sheet 31 has four contour lines 317 respectively connected to the end points of the side edges 315 and the connecting edges 316. The volume of each one of the swing structures 3A and the auxiliary swing structures 3B gradually reduces in the direction away from the base seat 1, so the shape of each contour line 317, which is defined from the fixing end 311 to the free end 312, can be a convex curve, concave curve, or oblique line. The preferable shape of each contour line 317 is a concave curve for reducing the volume of each sheet 31 effectively.

Although the volume of each sheet 31 in the instant embodiment gradually reduces in the direction away from the base seat 1, the length of each connecting edge 316 is unchanged to allow a flapping area for each sheet 31 to remain.

The operation of the third embodiment is similar to the operation of the first embodiment, so the operation of the third embodiment is not disclosed again. Based on the cantilever swing theory, when the Young's modulus of each sheet 31 is unchanged and each sheet 31 is integrally formed in one piece, the swinging frequency and the swinging range of each sheet 31 will be influenced by different cross-sectional areas (i.e., length of each side edge 315 is defined as a width A, length of each connecting edge 316 is defined as a thickness B, and the cross-sectional area is the width A multiplied by the thickness B). The cross-sectional area of each sheet 31 arranged close to the base seat 1 is greater than the cross-sectional area of each sheet 31 arranged away from the base seat 1, so a bottom portion of each sheet 31 arranged close to the base seat 1 has a larger swinging frequency and a smaller swinging range, and a top portion of each sheet 31 arranged away from the base seat 1 has a smaller swinging frequency and a larger swinging range. The bottom portion of each sheet 31 can drive the top portion to move, so that when the swinging frequency of the bottom portion of each sheet 31 is increased, the swinging frequency of the top portion of each sheet 31 will be increased. Moreover, the top portion of each sheet 31 has a larger swinging range so as to generate a strong air flow, thereby achieving good heat dissipating effect.

Figure 13:
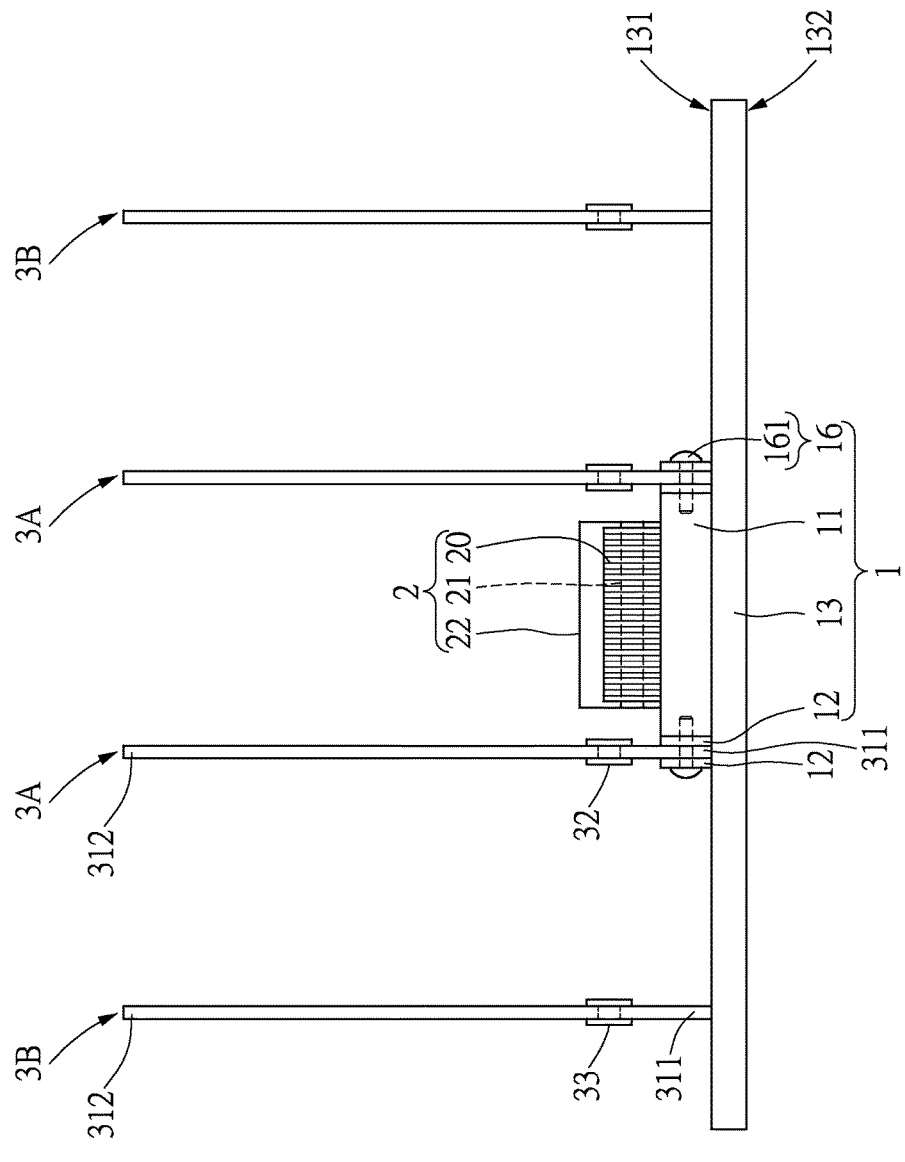
FIG. 13 is a perspective view showing a heat dissipating device according to a fourth embodiment of the instant disclosure.
Figure 14:
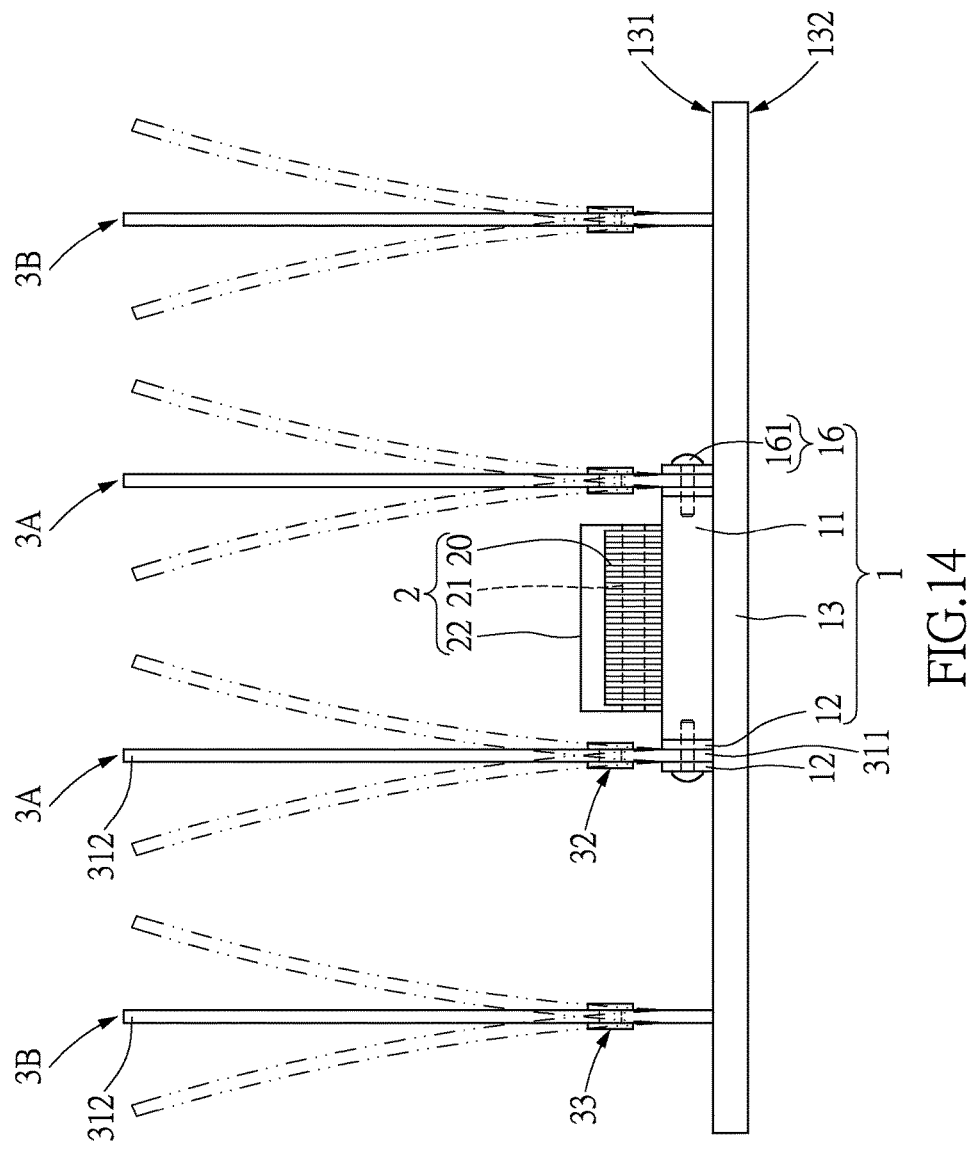
FIG. 14 is a perspective view showing the operation of the heat dissipating device of the fourth embodiment.

Please refer to FIGS. 13 and 14, which show the heat dissipating device 100 according to a fourth embodiment. The fourth embodiment is similar to the first embodiment, and the difference between the two embodiments is disclosed as follows.

Compared to the swing structure 3A of the first embodiment, each swing structure 3A of the fourth embodiment is provided without any swing magnetic member 33, and the position of the swing magnetic member 33 of each auxiliary swing structure 3B is aligned with the magnetic actuation 32 of the adjacent swing structure 3A. Moreover, the magnetic pole of the magnetic actuation 32 of each swing structure 3A is identical to the magnetic pole of the swing magnetic member 33 of the adjacent auxiliary swing structure 3B for generating a repulsing force there-between. The operation of the fourth embodiment is similar to the operation of the first embodiment, so the operation of the fourth embodiment is not disclosed again.

In addition, the number of the swing structure 3A in the instant embodiment is two, but the heat dissipating device 100 could be provided with only one swing structure 3A.

In summary, the heat dissipating device 100 can be adjusted for the heat generating members 9 of different size. If the heat generating member 9 has a longer shape, the heat dissipating device 100 can increase the number of the auxiliary swing structures 3B or increase the distance between the swing structures 3A and the auxiliary swing structures 3B. If the heat generating member 9 has a shorter shape, the heat dissipating device 100 can decrease the number of the auxiliary swing structures 3B or decrease the distance between the swing structures 3A and the auxiliary swing structures 3B. Thus, the heat dissipating device 100 can be customized according to different heat generating members 9, thereby achieving one of the subject matters of interest in the instant disclosure.

The construction and the operation of the heat dissipating device 100 applied to the method of the instant disclosure have been disclosed in the above description. Please refer to FIG. 1, which shows the power frequency compensation method for the heat dissipating device 100. The method includes steps as follows.

Step S110: the heat dissipating device 100 is provided. The elongated non-metal sheet 31 has a resonance frequency, which is changeable based on temperature, and the sheet 31 in the following description means the sheet 31 of the swing structure 3A, but is not limited thereto. Specifically, the resonance frequency of the sheet 31 can be influenced by changing the temperature of the heat dissipating device 100. For example, when the temperature of the heat dissipating device 100 is increased, the resonance frequency of the sheet 31 will be decreased; when the temperature of the heat dissipating device 100 is decreased, the resonance frequency of the sheet 31 will be increased. That is to say, the resonance frequency of the sheet 31 is in a negative correlation with the temperature of the heat dissipating device 100. The negative correlation of the resonance frequency of the sheet 31 and the temperature of the heat dissipating device 100 in the instant embodiment is a linear relationship, but is not limited thereto. When the resonance frequency of the sheet 31 is regarded as Y axis, the temperature of the heat dissipating device 100 is regarded as X axis, and the linear relationship between the heat dissipating device 100 and the resonance frequency of the sheet 31 in the instant embodiment is $Y=aX+b$, in which $a<0$ and $b>0$.

Accordingly, when the frequency of the periodic power received by the coil 20 of the heat dissipating device 100 matches (i.e., is substantially identical to) the resonance frequency of the sheet 31, the repeatedly changing magnetic field generated from the core 21 can attract or repulse the magnetic actuation 32 to cause the sheet 31 in a resonance mode to repeatedly swing the free end 312, thereby the operation of the heat dissipating device 100 can be maintained in a maximum efficiency.

Step S120: a temperature sensing module is used to sense a temperature value, which is corresponding to the resonance frequency of the sheet 31. The temperature value corresponding to the resonance frequency of the sheet 31 means the temperature of the heat dissipating device 100 (i.e., the temperature of the core 21) or temperature of an external environment, which can influence the temperature of the heat dissipating device 100. In more detail, the temperature of the heat dissipating device 100 will slightly influence the components arranged in the heat dissipating device 100, thereby influencing the resonance frequency of the sheet 31 directly. The temperature of the heat dissipating device 100 can be approximately obtained by using a conversion formula and the temperature of the external environment, so the temperature of the external environment can indirectly influence the resonance frequency of the sheet 31.

Moreover, the temperature sensing module has a first temperature sensor and a second temperature sensor, the first temperature sensor is configured to sense a temperature of the heat dissipating device 100, and the second temperature sensor is configured to sense a temperature of the external environment located outside of the heat dissipating device 100. The temperature sensing module in the instant embodiment has at least one of the first temperature sensor and the second temperature sensor.

Specifically, when the temperature sensing module only has the first temperature sensor, the step S120 is implemented by using the first temperature sensor to sense the temperature of the heat dissipating device 100. When the temperature sensing module only has the second temperature sensor, the step S120 is implemented by using the second temperature sensor to sense the temperature of the external environment and by converting the temperature of the external environment to approximately obtain the temperature of the heat dissipating device 100.

When the temperature sensing module has the first temperature sensor and the second temperature sensor, the step S120 is implemented by using the first temperature sensor to sense the temperature of the heat dissipating device 100, and the step S120 is also implemented by using the second temperature sensor to sense the temperature of the external environment and by converting the temperature of the external environment to approximately obtain the temperature of the heat dissipating device 100. Furthermore, the two temperature values of the heat dissipating device 100 respectively obtained by using the first and second temperature sensors can be verified with each other, such that if one of the first and second temperature sensors is broken (e.g., the difference between the two temperature values of the heat dissipating device 100 is too large), the broken one can be fixed as soon as possible to avoid influencing the operation of the heat dissipating device 100.

Step S130: a current periodic controller is electrically connected to the temperature sensing module and the heat dissipating device 100. The current periodic controller is configured to receive an external power for outputting a periodic power, and the current periodic controller is configured to receive a temperature value measured by the temperature sensing module. The current periodic controller immediately obtains the resonance frequency of the sheet 31 according to the temperature value and the relationship between the resonance frequency of the sheet 31 and the temperature of the heat dissipating device 100, thereby the current periodic controller can adjust the frequency of the periodic power to match (i.e., be substantially identical to) the resonance frequency, and then the periodic power is transmitted to the heat dissipating device 100.

Accordingly, when the coil 20 of the heat dissipating device 100 receives the periodic power, which has the frequency matching the resonance frequency of the sheet 31, the core 20 generates a repeatedly changing magnetic field to attract or repulse the magnetic actuation 32 for driving the magnetic actuation 32 to repeatedly move forward and backward with respect to the driving structure 2, thereby causing the sheet 31 in a resonance mode to repeatedly swing the free end 312.

In more detail, when the temperature of the heat dissipating device 100 is increased, the resonance frequency of the sheet 31 will be decreased, and the current periodic controller will adjust the frequency of the periodic power to match the resonance frequency of the sheet 31 at the same time. When the temperature of the heat dissipating device 100 is decreased, the resonance frequency of the sheet 31 will be increased, and the current periodic controller will adjust the frequency of the periodic power to match the resonance frequency of the sheet 31 at the same time. The temperature value received by the current periodic controller is in a negative correlation with the frequency of the periodic power outputted from the current periodic controller. The negative correlation in the instant embodiment is approximately a linear relationship, but is not limited thereto. When the frequency of the periodic power is regarded as Y axis, the temperature value is regarded as X axis, and the linear relationship between the frequency of the periodic power and the temperature value in the instant embodiment is Y=mX+n, in which m<0 and n>0.

Specifically, when the voltage is unchanged and the temperature is increased, a resistance value of the coil 20 of the heat dissipating device 100 is increased based on the increased temperature, so a current value received by the coil 20 of the heat dissipating device 100 is decreased. At the same time, the strength of the magnetic field generated from the driving structure 2 is decreased to cause the coefficient of elasticity of the sheet 31, which is influenced by the strength of the magnetic field, to be decreased, thereby reducing the resonance frequency of the sheet 31. Accordingly, the resonance frequency of the sheet 31 is in a positive correlation with the current value, such that the current value can be used to estimate the frequency of the periodic power, which matches the resonance frequency of the sheet 31. In more detail, the current periodic controller is used to detect the current value received by the heat dissipating device 100, so that the current periodic controller can immediately adjust the frequency of the periodic power to match (i.e., be substantially identical to) the resonance frequency of the sheet 31 according to the current value.

When the temperature sensing module has the first temperature sensor and the second temperature sensor, if the two temperature values of the heat dissipating device 100 respectively obtained by using the first and second temperature sensors have a difference in a predetermined range, the current periodic controller mainly accepts the temperature value measured by the first temperature sensor, but is not limited thereto; if a difference between the two temperature values is out of the predetermined range, at least one of the first and second temperature sensors is broken, so the temperature sensing module needs to be inspected and fixed.

In summary, the sequence of the steps S110, S120, S130 of the power frequency compensation method disclosed in the above embodiments is provided for explaining the method, but the sequence of the steps can be changed according to the actual request. For example, the current periodic controller can be electrically connected to the heat dissipating device 100 first, and then the temperature sensing module is electrically connected to the current periodic controller.

Figure 15:
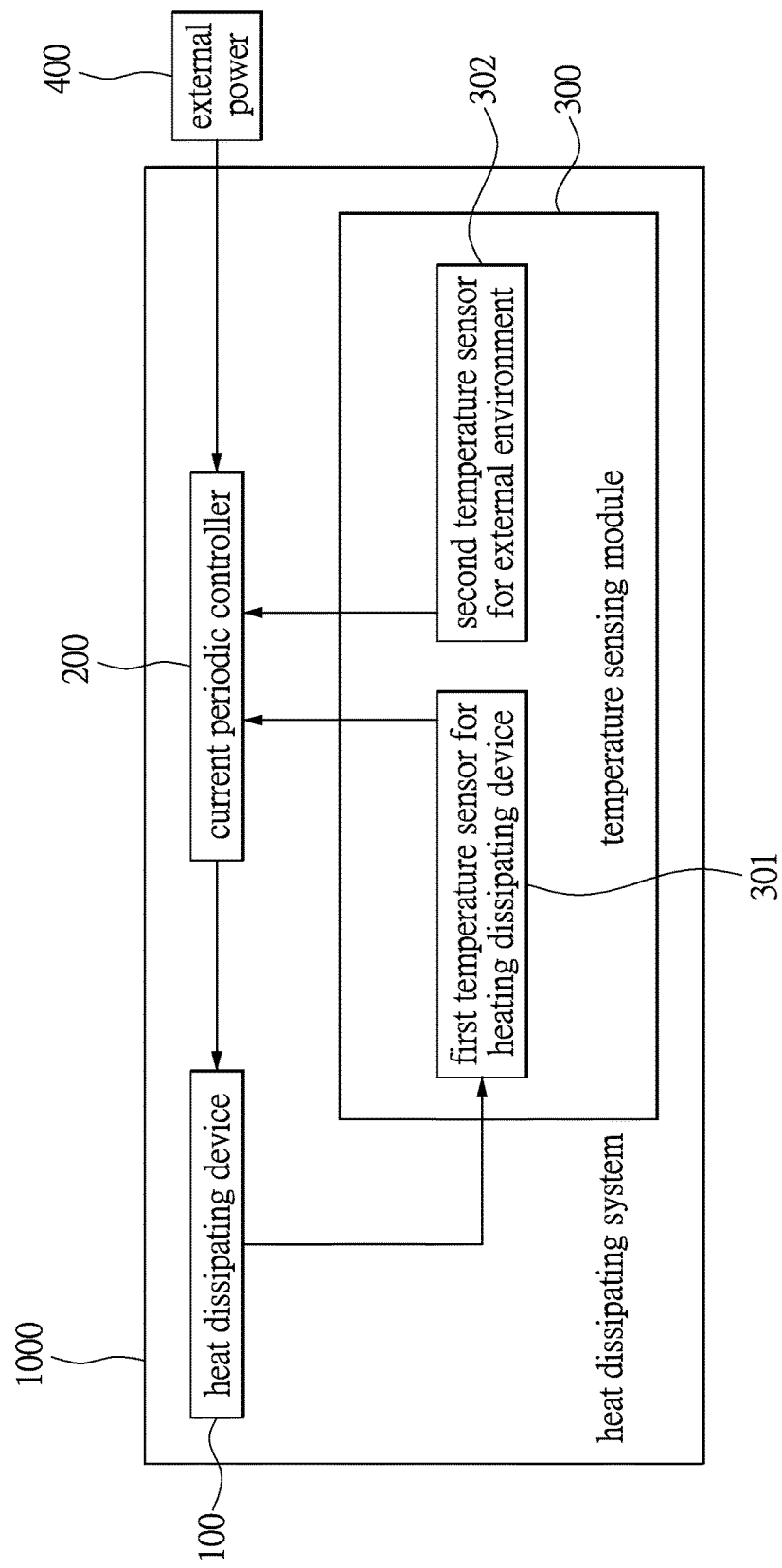
FIG. 15 is a functional block showing a heat dissipating system according to the instant disclosure.

Please refer to FIG. 15, which shows a sixth embodiment. The instant embodiment provides a heat dissipating system 1000, which is based on the power frequency compensation method. In other words, the power frequency compensation method of the above description is implemented by operating the heat dissipating system 1000 of the instant embodiment. The heat dissipating system 1000 of the instant embodiment can be applied to a server host, tablet PC, desktop computer, or another system which needs the heat dissipation function, but is not limited thereto.

The heat dissipating system 1000 includes the heat dissipating device 100 as disclosed in the above embodiments, a current periodic controller 200, and a temperature sensing module 300. The specific construction of the heat dissipating device 100 has been disclosed in the above embodiments, so the construction of the heat dissipating device 100 is not disclosed again. The following description only discloses the relationship between the heat dissipating device 100 and the other components. Moreover, the temperature sensing module 300 is configured to measure a temperature value, which corresponds to the resonance frequency of the sheet 31. The current periodic controller 200 is electrically connected to the temperature sensing module 300 for receiving the temperature value measured by the temperature sensing module 300. The current periodic controller 200 is electrically connected to the heat dissipating device 100.

The function of each component of the heat dissipating system 1000 and the relationship between the components of the heat dissipating system 1000 are further disclosed as follows.

The current periodic controller 200 is configured to receive an external power 400 for outputting the periodic power, and the current periodic controller 200 is used to adjust a frequency of the periodic power. The external power 400 can be an AC source or a pulse width modulation (PWM) DC source, but is not limited thereto. For example, when the external power 400 is a DC source, the current periodic controller 200 can be provided with a converter to transform the DC source into a PWM DC source.

The temperature sensing module 300 has a first temperature sensor 301 and a second temperature sensor 302, the first temperature sensor 301 is configured to sense a temperature of the heat dissipating device 100, and the second temperature sensor 302 is configured to sense a temperature of an external environment located out of the heat dissipating device 100. The first temperature sensor 301 or the second temperature sensor 302 can be a built-in temperature sensor, which is arranged in a server host, tablet PC, or desktop computer, thereby reducing the cost of the heat dissipating system 1000, but is not limited thereto. In addition, the temperature sensing module 300 in the instant embodiment includes the first temperature sensor 301 and the second temperature sensor 302 for example, but in practical use, the temperature sensing module 300 can only have one of the first temperature sensor 301 and the second temperature sensor 302.

Moreover, the temperature sensing module 300 can transmit the temperature value to the current periodic controller 200. The current periodic controller 200 immediately obtains the resonance frequency of the sheet 31 according to the temperature value and the relationship between the resonance frequency of the sheet 31 and the temperature of the heat dissipating device 100, thereby the current periodic controller 200 can adjust the frequency of the periodic power to match (i.e., be substantially identical to) the resonance frequency. In addition, the current periodic controller 200 is used to detect the current value received by the heat dissipating device 100, so that the current periodic controller 200 can immediately adjust the frequency of the periodic power to match (i.e., be substantially identical to) the resonance frequency of the sheet 31 according to the current value.

Accordingly, when the coil 20 of the heat dissipating device 100 receives the periodic power, which has the frequency matching the resonance frequency of the sheet 31, the core 20 generates a repeatedly changing magnetic field to attract or repulse the magnetic actuation 32 for driving the magnetic actuation 32 to repeatedly move forward and backward with respect to the driving structure 2, thereby causing the sheet 31 to repeatedly swing the free end 312 in a resonance mode.

[The Possible Effect of the Instant Disclosure]

In summary, the power frequency compensation method and the heat dissipating system of the instant disclosure are provided with the heat dissipating device, which can be customized according to different heat generating members. Moreover, the sheet of each swing structure is formed of non-metal material and is installed with at least one buffering pad for preventing a stress concentration problem from occurring to each sheet, thus the useful life of the sheet of each swing structure is increased and stable.

The temperature sensing module and the current periodic controller are cooperated to cause the sheet to repeatedly swing the free end in a resonance mode, thereby the operation of the heat dissipating device 100 can be maintained in a maximum efficiency.

Additionally, the temperature sensing module can be provided with the first temperature sensor and the second temperature sensor, and two temperature values of the heat dissipating device respectively obtained by using the first and second temperature sensors can be verified with each other, such that if one of the first and second temperature sensors is broken, the broken one can be fixed as soon as possible for avoiding to influence the operation of the heat dissipating device.

The descriptions illustrated supra set forth simply the preferred embodiments of the instant invention; however, the characteristics of the instant invention are by no means restricted thereto. All changes, alterations, or modifications conveniently considered by those skilled in the art are deemed to be encompassed within the scope of the instant invention delineated by the following claims.

What is claimed is:

1. A heat dissipating system comprising a heat dissipating device, the heat dissipating device comprising:
   a carrying structure having a base seat and at least one buffering pad disposed on the base seat;
   a driving structure disposed on the base seat and having a core and a coil winding around the core, wherein the driving structure is configured to generate a magnetic field having cyclical changes by receiving a periodic power; and
   at least one swing structure having an elongated non-metal sheet and a magnetic actuation disposed on the sheet, the position of the magnetic actuation corresponding to the position of the core; wherein the sheet has a fixing end and an opposite free end, the fixing end of the sheet is fixed on the base seat, and the buffering pad is arranged between the fixing end of the sheet and the base seat;
   wherein the magnetic actuation is configured to be driven by the magnetic field to repeatedly move forward and backward with respect to the driving structure, thus the sheet is enabled to repeatedly swing by the movement of the magnetic actuation,
   wherein the magnetic actuation includes two magnets attracted with each other and is mounted on a portion of the sheet corresponding to a centerline of the coil.

2. The heat dissipating system as claimed in claim 1, wherein the number of the buffering pad of the carrying structure is two, and the two buffering pads clip the fixing end of the sheet, the carrying structure has a screw passing through the fixing end of the sheet and coupling through the base seat for fixing the sheet to the base seat, and one of the buffering pads is arranged between a head portion of the screw and the fixing end of the sheet.

3. The heat dissipating system as claimed in claim 1, wherein the two magnets are mounted on the portion of the sheet corresponding to the centerline of the coil.

4. The heat dissipating system as claimed in claim 3, wherein the portion of the sheet corresponding to the centerline of the coil is defined as a positioning portion, the positioning portion has a thru-hole, one of the magnets partially couples through the thru-hole of the positioning portion to engage with another magnet.

5. The heat dissipating system as claimed in claim 3, wherein a centerline of the magnetic actuation is parallel to the centerline of the coil, a predetermined distance exists between the centerline of the magnetic actuation and the centerline of the coil, and the predetermined distance is smaller than or identical to a radius of the coil.

6. The heat dissipating system as claimed in claim 3, wherein an angle between a centerline of the magnetic actuation and the centerline of the coil is smaller than or identical to five degrees.

7. The heat dissipating system as claimed in claim 1, wherein the driving structure has a frame for supporting the core, and the base seat and the frame are integrally formed in one piece.

8. The heat dissipating system as claimed in claim 1, wherein the sheet has a first segment disposed on the base seat and a second segment connected to the first segment, the second segment is arranged away from the base seat, a Young's modulus of the first segment is greater than a Young's modulus of the second segment.

9. The heat dissipating system as claimed in claim 1, wherein the sheet has a cross-sectional area perpendicular to a longitudinal direction thereof, and the cross-sectional area of the sheet gradually reduces from the fixing end to the free end.

10. The heat dissipating system as claimed in claim 1, wherein the swing structure has a swing magnetic member disposed on the sheet, the swing magnetic member is arranged apart from the magnetic actuation; the heat dissipating device comprises an auxiliary swing structure disposed on the carrying structure, the swing structure is arranged closer to the driving structure than the auxiliary swing structure, the auxiliary swing structure has an elongated non-metal sheet and a magnetic actuation disposed on the sheet, the position of the magnetic actuation of the auxiliary swing structure corresponds to the position of the magnetic actuation of the swing structure, wherein the sheet of the auxiliary swing structure has a fixing end disposed on the carrying structure and an opposite free end, the magnetic actuation of the auxiliary swing structure magnetically repulses the magnetic actuation of the swing structure.

11. The heat dissipating system as claimed in claim 1, wherein the fixing end of the sheet is fixed on the base seat by using the buffering pad.

12. A heat dissipating system comprising a heat dissipating device, the heat dissipating device comprising:
   a carrying structure having a base seat and at least one buffering pad disposed on the base seat;
   a driving structure disposed on the base seat and having a core and a coil winding around the core, wherein the driving structure is configured to generate a magnetic field having cyclical changes by receiving a periodic power;
   at least one swing structure having an elongated non-metal sheet and a magnetic actuation disposed on the sheet, the position of the magnetic actuation corresponding to the position of the core; wherein the sheet has a fixing end and an opposite free end, the fixing end of the sheet is fixed on the base seat, and the buffering pad is arranged between the fixing end of the sheet and the base seat; and
   a current periodic controller and a temperature sensing module electrically connected to the current periodic controller;
   wherein the magnetic actuation is configured to be driven by the magnetic field to repeatedly move forward and backward with respect to the driving structure, thus the sheet is enabled to repeatedly swing by the movement of the magnetic actuation;
   wherein the current periodic controller is configured to receive an external power for outputting the periodic power to the driving structure, the sheet of the swing structure has a resonance frequency, the resonance frequency is changeable based on temperature, the current periodic controller is enabled to adjust a frequency of the periodic power, wherein the temperature sensing module is configured to sense a temperature value corresponding to the resonance frequency and to transmit the temperature value to the current periodic controller, thereby the current periodic controller is enabled to adjust the frequency of the periodic power to match the resonance frequency according to the temperature value.

13. The heat dissipating system as claimed in claim 12, wherein the temperature sensing module has at least one of a first temperature sensor and a second temperature sensor, the first temperature sensor is configured to sense a temperature of the heat dissipating device, and the second temperature sensor is configured to sense a temperature of an external environment located outside of the heat dissipating device.

14. The heat dissipating system as claimed in claim 12, wherein the temperature value measured by the temperature sensing module is approximately in a negative correlation with the resonance frequency of the sheet.

15. The heat dissipating system as claimed in claim 12, wherein the current periodic controller is configured to detect a current value received by the heat dissipating device for adjusting the frequency of the periodic power to match the resonance frequency according to the current value.

* * * * *